(12) United States Patent
Kawauchi et al.

(10) Patent No.: US 7,135,271 B2
(45) Date of Patent: Nov. 14, 2006

(54) PHOTOSENSITIVE COMPOSITION

(75) Inventors: Ikuo Kawauchi, Shizuoka (JP); Ippei Nakamura, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/928,107

(22) Filed: Aug. 30, 2004

(65) Prior Publication Data

US 2005/0058934 A1    Mar. 17, 2005

(30) Foreign Application Priority Data

Sep. 1, 2003    (JP) .............................. 2003-308751

(51) Int. Cl.
*G03C 1/73*    (2006.01)
*G03F 7/039*    (2006.01)

(52) U.S. Cl. .............................. 430/270.1; 430/287.1; 430/280.1; 430/326; 430/905; 430/906; 430/910; 430/944

(58) Field of Classification Search ............. 430/270.1, 430/287.1, 280.1, 905, 910, 944, 325, 326, 430/330
See application file for complete search history.

(56) References Cited

U.S. PATENT DOCUMENTS

| | | | | |
|---|---|---|---|---|
| 5,731,123 | A * | 3/1998 | Kawamura et al. | 430/176 |
| 6,573,022 | B1 | 6/2003 | Miyake et al. | |
| 2004/0009426 | A1 * | 1/2004 | Goto et al. | 430/270.1 |
| 2004/0067434 | A1 * | 4/2004 | Kano et al. | 430/270.1 |
| 2005/0043173 | A1 * | 2/2005 | Tsuchimura | 503/201 |

* cited by examiner

*Primary Examiner*—Sin Lee
(74) *Attorney, Agent, or Firm*—Sughrue Mion, PLLC

(57) ABSTRACT

The positive type photosensitive composition of the present invention comprises a polymer compound (A) having, in a side chain thereof, a polymerizable group or a cross-linkable group, and an infrared absorbent (B). Preferably, the polymerizable group or cross-linkable group is incorporated into molecules of the polymer compound (A) through a structural unit having this group in a side chain thereof. Specifically, the structural unit is preferably a structural unit having any one of structures represented by the following general formulae (1) to (4):

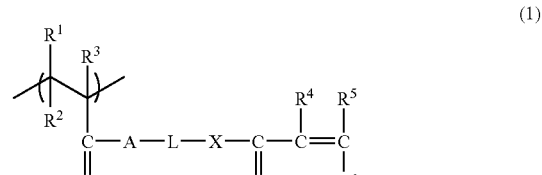

(1)

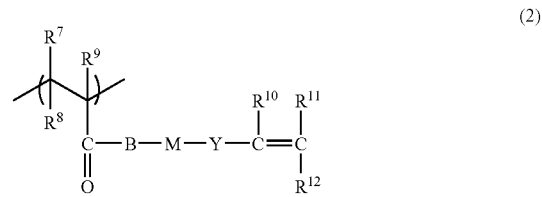

(2)

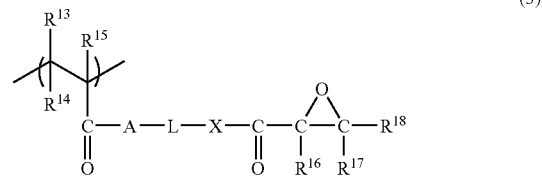

(3)

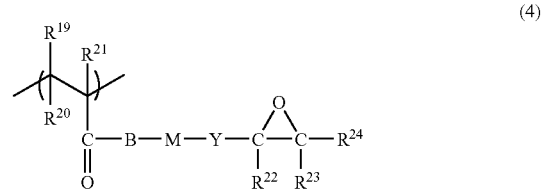

(4)

wherein A, B, X each independently represents a single bond, an oxygen atom, a sulfur atom or the like; L and M each independently represent a bivalent organic group; $R^1$ to $R^{12}$ represents a hydrogen atom or a monovalent organic group; $R^{13}$ to $R^{24}$ each independently represents a monovalent organic group; and Y represents an oxygen atom, a sulfur atom, or a phenylene group which may have a substituent.

32 Claims, No Drawings

PHOTOSENSITIVE COMPOSITION

CROSS-REFERENCE TO RELATED APPLICATION

This application claims priority under 35 USC 119 from Japanese Patent Application No. 2003-308751, the disclosure of which is incorporated by reference herein.

BACKGROUND OF THE INVENTION

1. Field of the Invention

The present invention relates to a positive type photosensitive composition, the solubility of which, in an aqueous alkaline solution, is enhanced by being exposed to infrared rays. More specifically, the invention relates to a positive type photosensitive composition useful as a recording layer of a planographic printing plate precursor that can be subjected to the so-called direct plate-making method, according to which a printing plate can be directly made up by scanning of an infrared laser on the basis of digital signals received from a computer or the like.

2. Description of the Related Art

Hitherto, various photosensitive compositions have been used for the formation of visible images, or as a material for planographic printing plate precursors. Recently, remarkable developments have taken place in the area of lasers for planographic printing. With particular, regard to both solid lasers and semiconductor lasers having an emission wavelength within a near infrared or infrared wavelength range, it has become easy to obtain lasers which have a high level of output and which are at the same time compact. These lasers are extremely useful as light sources for exposure when printing plates are made up directly on the basis of digital data received from a computer or the like.

Materials which can be used for positive type planographic printing plate precursors applicable for infrared lasers include, as essential components, a binder resin soluble in an aqueous alkaline solution (hereinafter referred to where appropriate as an "alkali-soluble resin"), and an infra red dye which absorbs light to generate heat. When an image is formed in a positive type planographic printing plate precursor, the infra red dye interacts with the binder resin in its unexposed portions (image portions) so as to function as a dissolution inhibitor which can substantially reduce the solubility of the binder resin. On the other hand, in its exposed portions (non-image portions), interaction of the infra red dye with the binder resin is weakened by the heat generated. Consequently, an exposed portion can turn into a state in which it can be dissolved in an alkaline developer, so that an image is formed thereon.

However, insofar as infrared-laser-applicable positive planographic printing plate precursor materials are concerned, differences in the degree of resistance against dissolution in a developer between unexposed portions (image portions) and exposed portions (non-image portions) therein, that is, differences in development latitude have not yet been sufficient under various conditions of use. Thus, problems have occurred insofar that, with changes in conditions of use of materials, materials have tended to be either excessively developed or inadequately developed.

Such problems stem from fundamental differences in plate-making mechanisms between infrared-laser-applicable positive type planographic printing plate precursor materials and positive type planographic printing plate precursor materials from which printing plates are made up by exposure to ultra violet rays.

In other words, positive type planographic printing plate precursor materials from which printing plates are made up by exposure to ultra violer rays each include, as essential components, a binder resin soluble in an aqueous alkaline solution and an onium salt, or a quinonediazide compound. This onium salt or quinonediazide compound not only interacts with the binder resin in unexposed portions (image portions) to function as a dissolution inhibitor, but in exposed portions (non-image portions) it is also decomposed by light and generates an acid to function as a dissolution promoter. In this way, the onium salt, or the quinonediazide compound, performs dual functions.

On the other hand, in infrared-laser-applicable positive type planographic printing plate precursor materials, the infra red dye functions only as a dissolution inhibitor of unexposed portions (image portions), and does not promote the dissolution of exposed portions (non-image portions). Furthermore, heat generated in exposed portions near the interface between the photosensitive layer and the support diffuses to the support. Thus, in some cases heat may not be effectively used for forming images. As a result, the materials of this type have a drawback insofar that a film residue is easily generated. Accordingly, demands have been made for infrared-laser-applicable positive type planographic printing plate precursor materials which have both a high sensitivity and a wide development latitude.

As solutions to these problems, in order to maintain the rate of the residual film in image portions low and to increase the degree of contrast between image portions and non-image portions, the following examples have been disclosed: an example wherein an organic acid such as polyacrylic acid is also used in a positive type photosensitive composition including a photothermal conversion material and an alkali-soluble resin (see, for example, Japanese Patent Application Laid-Open (JP-A) No. 10-282643); an example wherein a methyl methacrylate-(meth)acrylic acid copolymer is also used in the same composition (see, for example, JP-A No. 2001-324808); and other examples. However, these examples are have proved inadequate in the terms of compatibility between the image-formability of the compositions (in particular, alkali resistance of image portions, which should not be too high) and the storage stability thereof.

A technique wherein a recording layer is made into a multilayered structure, thereby improving the stability of the layer has also been suggested. A positive type image forming material has been disclosed which has a lower layer including a sulfonamide-containing polymer, and an upper layer containing a resin having a phenolic hydroxyl group and an infrared absorbent (see, for example, JP-A No. 11-218914). However from the viewpoint of the printing resistance of image portions, there is still scope for improvement.

A technique has also been suggested in which a lower layer includes an alkali-soluble binder and an upper layer includes an epoxy compound and a curing agent, the upper layer being cross-linked by being heated up to a temperature of about 100° C. at the time when it is applied and dried, thereby improving the alkali resistance of the layers (see, for example, EP patent No. 960728). Since under this system the epoxy compound and the curing agent are made to coexist in the upper layer, a cross-linking reaction is generated only in the upper layer, at the time that it is being dried after application. Thus, the depths of the recording layer which has been cured are insufficient and the printing resistance can accordingly not be improved. Moreover, in this case, improvements in printing resistance by the burning treatment cannot be obtained.

SUMMARY OF THE INVENTION

Taking due consideration of the drawbacks in the related art, an object of the present invention is to provide a positive type photosensitive composition suitable as a recording material for infrared-laser-applicable planographic printing plate precursors, which can produce excellent printing resistance in image portions, which printing resistance is most effectively improved by means of burning treatment.

As a result of intensive research, the present inventors have discovered that the problems described above can be solved by using a polymer compound having, in a side chain thereof, a specific reactive group, and they have thus produced the invention.

Specifically, the positive type photosensitive composition of the invention include both a polymer compound (A) having, in a side chain thereof, a polymerizable group or a cross-linkable group, and an infrared absorbent (B). Hereinafter, this polymer compound (A) may where appropriate be referred to as a "polymerizable polymer".

It is preferable that the polymer compound (A) is produced by introducing a structural unit having a polymerizable group or a cross-linkable group in a side chain thereof into a molecule of the polymer compound (A) precursor.

Preferable examples of this structural unit having a polymerizable group include (meth)acrylic acid esters each having, in a side chain thereof, a carbon-carbon unsaturated bond, and structural units each having a structure represented by one of the following general formulae (1) and (2):

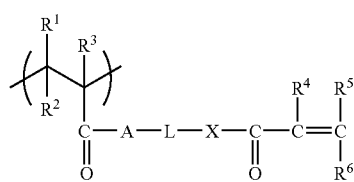
(1)

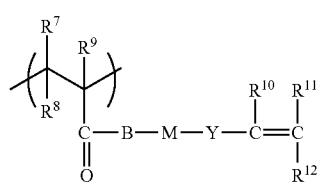
(2)

wherein A, B and X each independently represents a single bond, an oxygen atom, a sulfur atom, or —N(R$^{01}$)—, wherein R$^{01}$ represents a hydrogen atom or a monovalent organic group; L and M each independently represents a bivalent organic group; R$^1$ to R$^{12}$ each independently represents a monovalent organic group; and Y represents an oxygen atom, a sulfur atom, —N(R$^{02}$)—, wherein R$^{02}$ represents a hydrogen atom or a monovalent organic group, or a phenylene group which may have a substituent.

Preferable examples of the structural unit having a cross-linkable group include epoxy (meth)acrylate, glycidyl (meth)acrylate, and structural units each having a structure by one of the following general formulae (3) and (4):

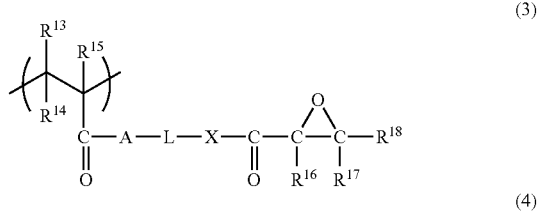
(3)

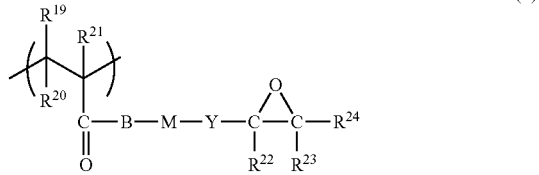
(4)

wherein A, B and X each independently represents a single bond, an oxygen atom, a sulfur atom, or —N(R$^{03}$)—, wherein R$^{03}$ represents a hydrogen atom or a monovalent organic group; L and M each independently represents a bivalent organic group; R$^{13}$ to R$^{24}$ each independently represents a monovalent organic group; and Y represents an oxygen atom, a sulfur atom, —N(R$^{04}$)—, wherein R$^{04}$ represents a hydrogen atom or a monovalent organic group, or a phenylene group which may have a substituent.

Besides (A) and (B), the photosensitive composition of the invention preferably contains also an alkali-soluble resin (C).

In the present specification, both or either of "acrylic" and "methacrylic" may be represented by "(meth)acrylic", and both or either of "acrylate" and "methacrylate" may be represented by "(meth)acrylate".

Since the above-mentioned positive type photosensitive composition contains a specific polymerizable polymer, the composition is excellent in terms of film-formability. Furthermore, since the specific polymerizable polymer interacts with a coexisting infrared absorbent, the composition is excellent in terms of resistance against an alkaline developer. Furthermore, since this interaction can be easily counterbalanced by means of an infrared laser or thermal energy, a high sensitivity is achieved.

A polymerization reaction is caused, or a cross-linked structure can be formed, within the structure of the polymerizable polymer molecules or optionally between the molecules and an alkali-soluble resin which can be added, by means of energy such as heat. Therefore, in a case where a composition is imagewise exposed to light and developed and the composition on a support subjected to heating treatment such as burning treatment, the composition is sufficiently cured in a lower portion thereof, in particular, in the vicinity of the support. In such cases, heat from the support also contributes to curing of the vicinity, and a sufficient degree of curing causes a drastic improvement in the printing resistance of image portions. Hereinafter, superior printing resistance obtained by burning treatment may, where appropriate be referred to as "burning printing resistance".

According to the invention, it is possible to provide a positive type photosensitive composition suitable as a recording material for infrared-laser-applicable planographic printing plate precursors, which can not only produce excellent printing resistance in image portions but can also bring about a marked improvement in printing resistance by means of burning treatment.

DETAILED DESCRIPTION OF THE INVENTION

The photosensitive composition of the present invention comprises a polymer compound (A) having, in a side chain thereof, a polymerizable group or a cross-linkable group, and an infrared absorbent (B). From the viewpoint of film-formability, the photosensitive composition of the invention preferably comprises an alkali-soluble resin (C).

The following is a detailed description of each of the components of the photosensitive composition of the invention.

[Polymer Compound (A) Having, in a Side Chain Thereof, a Polymerizable Group or a Cross-linkable Group (i.e., Polymerizable Polymer)]

It is essential that the specific polymerizable polymer (A) related to the invention has, in a side chain thereof, a polymerizable group or a cross-linkable group. Specifically, it is preferable that a polymerizable polymer contains, as a polymerizing component, a structural unit having a polymerizable group or a cross-linkable group.

In a case where the polymerizable polymer has the polymerizable group, preferable examples of the structural unit having a polymerizable group, which unit is contained in the polymer, include acrylic acid esters each having, in a side chain thereof, a carbon-carbon unsaturated bond, methacrylic acid esters each having, in a side chain thereof, a carbon-carbon unsaturated bond, and structural units each having a structure represented by the following general formula (1) or general formula (2):

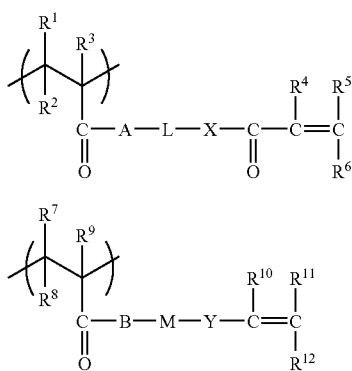

wherein A, B and X each independently represents a single bond, an oxygen atom, a sulfur atom, or —N(R$^{O1}$)—, wherein R$^{O1}$ represents a hydrogen atom or a monovalent organic group; L and M each independently represents a bivalent organic group; R$^1$ to R$^{12}$ each independently represents a hydrogen atom or a monovalent organic group; and Y represents an oxygen atom, a sulfur atom, —N(R$^{O2}$)— wherein R$^{O2}$ represents a hydrogen atom or a monovalent organic group, or a phenylene group which may have a substituent.

Each of —C(O)—A—L—X— in general formula (1) and —C(O)—B—M—Y in general formula (2) functions as a bivalent linking group for linking the polymerizable group of each terminal thereof to a straight chain in the whole. Specifically, this bivalent linking group preferably has a structure which has therein O, S, N or the like and which is polymerized in a state in which the terminal polymerizable groups remain unpolymerized after the polymerizable polymer has been synthesized.

When R$^1$ to R$^{12}$ each represents a monovalent organic group, the organic group may be an alkyl or an aryl group, and is preferably an alkyl group.

In a case where the polymerizable polymer has the cross-linkable group, preferable examples of the structural unit having the cross-linkable group, which unit is contained in the polymer, include epoxy acrylate, epoxy methacrylate, glycidyl acrylate, glycidyl methacrylate, and structural units each having a structure represented by the following general formula (3) or general formula (4):

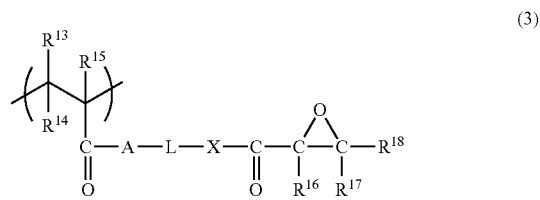

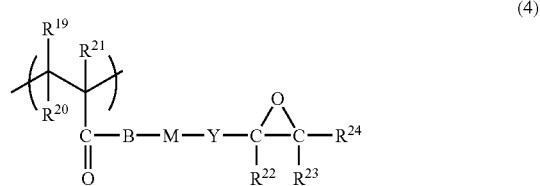

wherein A, B and X each independently represents a single bond, an oxygen atom, a sulfur atom, or —N(R$^{O3}$)—, wherein R$^{O3}$ represents a hydrogen atom or a monovalent organic group; L and M each independently represents, a bivalent organic group; R$^{13}$ to R$^{24}$ each independently represents, a monovalent organic group; and Y represents an oxygen atom, a sulfur atom, —N(R$^{O4}$)—, wherein R$^{O4}$ represents a hydrogen atom or a monovalent organic group, or a phenylene group which may have a substituent.

Each of —C(O)—A—L—X— in general formula (3) and —C(O)—B—M—Y in general formula (4) functions as a bivalent linking group for linking the polymerizable group of each terminal thereof to a straight chain in the whole. This bivalent linking group has the same meaning as in general formula (1) or (2).

When R$^{13}$ to R$^{24}$ each represents a monovalent organic group, the organic group may be an alkyl or aryl group and is preferably an alkyl group.

Regarding the type of the polymerizable polymer (A), structural units having, in a side chain, the polymerizable group or cross-linkable group may either be of a single type or combinations of two or more types.

(Other Copolymerization Components)

In addition to the preferable structural units mentioned above, the specific polymerizable polymer according to the invention may comprise, as copolymerization components, various structural units as long as the advantageous effects of the invention are not adversely affected.

In particular, in order to give alkali-solubility to the specific polymerizable polymer, it is preferable to use a structural unit having an alkali-soluble group. In order to give the specific polymerizable polymer flexibility or solubility in a solvent, it is preferable to use alkyl (meth)acrylate as one of the copolymerization components.

Preferable examples of the alkali-soluble group include acidic groups set out in the following items (1) to (6). Structural units having, in the main chain thereof and/or a side chain thereof, an acidic group are preferable from a viewpoint of the solubility in an alkaline developer, or as an expression of a capability for suppressing dissolution therein.
(1) A phenol group (—Ar—OH)
(2) Sulfonamide groups (—$SO_2NH$—R)
(3) Substituted sulfonamide based groups (hereinafter referred to as "active imide groups")
[—$SO_2NHCOR$—, —$SO_2NHSO_2R$, and —$CONHSO_2R$]
(4) A carboxylic acid group (—$CO_2H$)
(5) A sulfonic acid group (—$SO_3H$)
(6) A phosphoric acid group (—$OPO_3H_2$)

In items (1) to (6), Ar represents a bivalent aryl linking group which may have a substituent, and R represents a hydrogen atom or a hydrocarbon group which may have a substituent.

Among alkali-soluble resins having an acidic group selected from among items (1) to (6), alkali-soluble resins having a phenol group (item (1)), a sulfonamide group (item (2)) or an active imide group (item (3)) are preferable. Alkali-soluble resins having a phenol group (item (1)) or a sulfonamide group (item (2)) are particularly preferable since the resins can maintain adequate solubility in an alkaline developer, adequate development latitude, and adequate film strength.

Among alkyl (meth)acrylates, which are another preferable structural unit, the alkyl group is preferably an alkyl group having 2 or more carbon atoms, thus giving flexibility to the specific polymerizable polymer by means of the alkyl group which become a side chain. In order to further enhance the flexibility of the polymer, the number of carbon atoms in the alkyl group, which may vary depending on the polymerization component containing the acidic group, which group are to be combined with this structural unit, is preferably 3 or more.

In a case where an alkaline-soluble resin is used as one of the resins which constitute the photosensitive composition, in order not to hinder the miscibility or compatibility of this resin, the number of carbon atoms in the alkyl group is preferably 10 or less, and more preferably 8 or less.

Specific examples of the alkyl acrylate which is preferably used as the copolymerization component include methyl acrylate, ethyl acrylate, butyl acrylate, isobutyl acrylate, isoamyl acrylate, hexyl acrylate, 2-ethylhexyl acrylate, and cyclohexyl acrylate. Specific examples of the alkyl methacrylate include methyl methacrylate, ethyl methacrylate, isopropyl methacrylate, butyl methacrylate, isobutyl methacrylate, hexyl methacrylate, 2-ethylhexyl methacrylate, and cyclohexyl methacrylate. Among these examples, preferable are ethyl acrylate, butyl acrylate, isobutyl acrylate, isoamyl acrylate, ethyl methacrylate, isopropyl methacrylate, butyl methacrylate, isobutyl methacrylate, and hexyl methacrylate, and particularly preferable are butyl acrylate, isobutyl acrylate, isopropyl methacrylate, butyl methacrylate, and isobutyl methacrylate.

A copolymerization component other than the structural unit having an alkali-soluble group or the alkyl (meth) acrylate is not particularly limited, providing that the component is a monomer component which in turn can be copolymerized with the monomer can form the abovementioned preferable structural unit having a polymerizable group or a cross-linkable group. Preferable examples of the copolymerization component include monomers set out the following items (1) to (10):

(1) Acrylic acid esters and methacrylic acid esters having an aliphatic hydroxyl group, such as 2-hydroxyethyl acrylate and 2-hydroxyethyl methacrylate.
(2) Alkyl acrylates having a substituent, such as benzyl acrylate, 2-chloroethyl acrylate, glycidyl acrylate, and N-dimethylaminoethyl acrylate.
(3) Alkyl methacrylates having a substituent, such as benzyl methacrylate, 2-chloroethyl methacrylate, glycidyl methacrylate, and N-dimethylaminoethyl methacrylate.
(4) Vinyl ethers, such as ethyl vinyl ether, 2-chloroethyl vinyl ether, hydroxyethyl vinyl ether, propyl vinyl ether, butyl vinyl ether, octyl vinyl ether, and phenyl vinyl ether.
(5) Vinyl esters, such as vinyl acetate, vinyl chloroacetate, vinyl butyrate, and vinyl benzoate.
(6) Styrenes, such as styrene, α-methylstyrene, methylstyrene, and chloromethylstyrene.
(7) Vinyl ketones, such as methyl vinyl ketone, ethyl vinyl ketone, propyl vinyl ketone, and phenyl vinyl ketone.
(8) Olefins, such as ethylene, propylene, isobutylene, butadiene, and isoprene.
(9) Acrylonitrile, methacrylonitrile, and so on.
(10) Unsaturated imides, such as N-acryloylacrylamide, N-acetylmethacrylamide, N-propionylmethacrylamide, and N-(p-chlorobenzoyl)methacrylamide.

In relation to the total copolymerization components constituting specific polymerizable polymer (A) related to the invention, the percentage occupied by the structural unit having in a side chain thereof a polymerizable or cross-linkable group is preferably 5% by mole or more, and more preferably 10% by mole or more. When the percentage is within this range, alkali resistance of unexposed portions and film strength are good, and improvements in film strength can be attained by burning. Furthermore, an application in which the photosensitive composition comprising this specific polymerizable polymer is used as a recording layer of a planographic printing plate precursor is preferable since the recording layer is then excellent in terms of printing resistance, chemical resistance and burning printing resistance.

In relation to the total amount of copolymerization components the percentage occupied by the structural unit containing the alkali-soluble group, which group may optionally be used in combination, is preferably 10% by mole or more.

The weight average molecular weight of the specific polymerizable polymer according to the invention is preferably from 100,000 to 300,000, more preferably from 20,000 to 200,0000, and even more preferably from 35,000 to 150,000. When the molecular weight is within this range, a satisfactory film (film-formability), and superior developability, can be obtained.

Further, in a case where the photosensitive composition of the invention is used as a recording layer of a planographic printing plate precursor, from the viewpoint of the printing resistance of the recording layer, the content by percentage occupied by the specific polymerizable polymer, in relation to the total solid contents or the photosensitive composition, is preferably 10% or more by mass, and more preferably 30 to 99.9% by mass.

Specific examples (P-1 to P-5) of the specific polymerizable polymer (A), which are preferably used in the invention, are described hereinafter in terms of monomers which constitute the polymer, mole ratios between the monomers, and weight average molecular weights (MW) of the polymer. In the invention, however, the specific polymerizable polymer (A) is not limited to these examples.

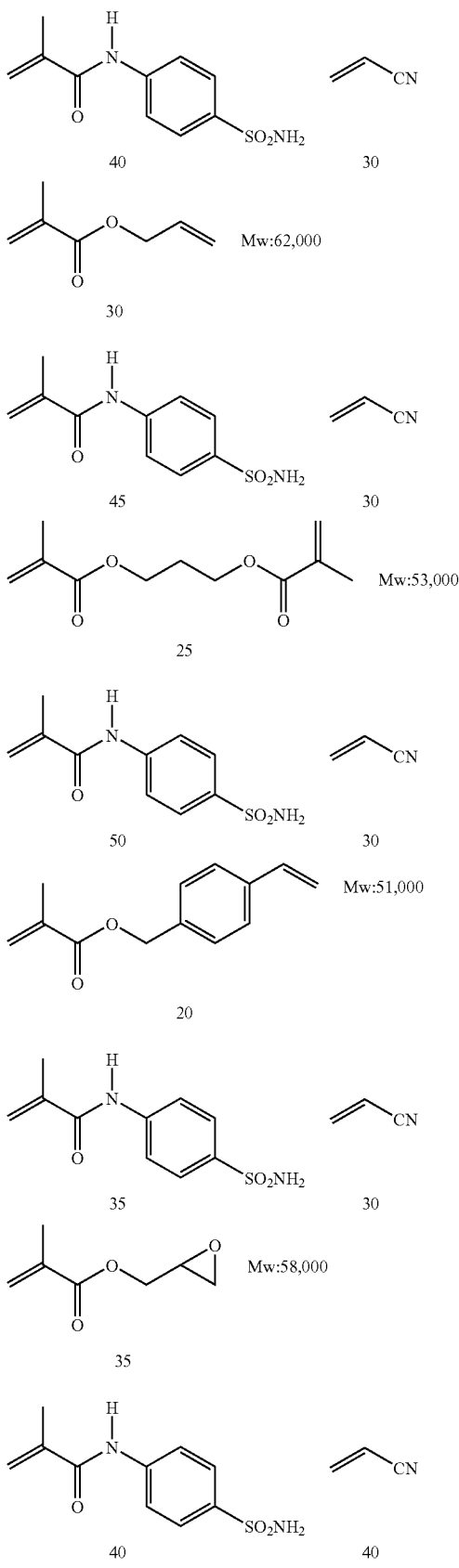
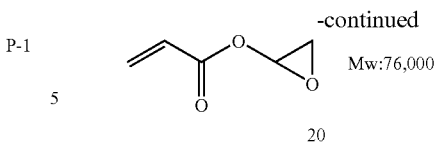

The reaction solvent which is optionally used at times when radical polymerization for the production of the composition of the invention is conducted may be any solvent, as long as a monomer having an acid group, an amide group, and/or an amino group, and other copolymerization components can be dissolved in the solvent. In consideration that the solvents should produce a minimum effect on the radical polymerizable reaction and allow each of the monomers to be satisfactorily dissolved therein, preferable examples of the solvent include ketones such as acetone, and methyl ethyl ketone; alcohols such as methanol, ethanol, isopropyl alcohol and 1-methoxy-2-propanol; and amide-based solvents such as N,N-dimethylacetoamide and N,N-dimethylformamide.

At the time of the radical polymerization reaction, a polymerization initiator may optionally be used. This polymerization initiator may be any one selected from various thermopolymerization initiators and photopolymerization initiators, and is preferably an azo type thermopolymerization initiator since such an initiator is easily handled, and also readily available. Preferable examples of the initiator include azonitrile compounds (trade names: V-70, V-60 and V-65, manufactured by Wako Pure Chemicals, Industries); azoamidine compounds (trade names: VA-545 and VA-041, manufactured by Wako Pure Chemicals, Industries); azoamide compounds (trade names: VA-080 and VA-082, manufactured by Wako Pure Chemicals, Industries); and other azo compounds (trade names: V-601, V-501 and VF-077, manufactured by Wako Pure Chemicals, Industries). Among these examples, initiators V-65 and V-601 are particularly preferable.

Further, at the time of polymerization, the composition of the terminal portion of the copolymer, and/or the molecular weight thereof may be controlled by the combined use of a known chain transfer agent, a typical example of which is mercapto compounds. Furthermore each of the monomer units incorporated into the copolymer may be in either in a block form or in random form.

[Infrared Absorbent (B)]

The infrared absorbent used in the invention may be any infrared absorbent that absorbs light energy radiating rays to generate heat. The absorption wavelength of the infrared absorbent is not particularly limited. From the viewpoints of suitability to high-power lasers and being readily available, preferable examples thereof include infrared absorbing dyes and pigments having an absorption maximum in a wavelength range of 760 to 1200 nm.

The dyes may be commercially available ones and known ones described in publications such as "Dye Handbook" (edited by the Society of Synthesis Organic Chemistry, Japan, and published in 1970). Specific examples thereof include azo dyes, metal complex azo dyes, pyrazolone azo dyes, naphthoquinone dyes, anthraquinone dyes, phthalocyanine dyes, carbonium dyes, quinoneimine dyes, methine dyes, cyanine dyes, squalirium dyes, pyrylium dyes, metal thiolate complexes, oxonol dyes, diimonium dyes, aminium dyes, and croconium dyes.

Preferable examples of the dye include cyanine dyes described in JP-A Nos. 58-125246, 59-84356, 59-202829, and 60-78787; methine dyes described in JP-A Nos. 58-173696, 58-181690, and 58-194595; naphthoquinone dyes described in JP-A Nos. 58-112793, 58-224793, 59-48187, 59-73996, 60-52940, and 60-63744; squalirium dyes described in JP-A No. 58-112792; and cyanine dyes described in GB Patent No. 434,875.

Other preferable examples of the dye include near infrared absorbing sensitizers described in U.S. Pat. No. 5,156,938; substituted arylbenzo(thio)pyrylium salts described in U.S. Pat. No. 3,881,924; trimethinethiapyrylium salts described in JP-A No. 57-142645 (U.S. Pat. No. 4,327,169); pyrylium type compounds described in JP-A Nos. 58-181051, 58-220143, 59-41363, 59-84248, 59-84249, 59-146063, and 59-146061; cyanine dyes described in JP-A No. 59-216146; pentamethinethiopyrylium salts described in U.S. Pat. No. 4,283,475; and pyrylium compounds described in Japanese Patent Application Publication (JP-B) Nos. 5-13514 and 5-19702.

Additional preferable examples of the dye include near infrared absorbing dyes represented by formulae (I) and (II) as described in U.S. Pat. No. 4,756,993.

Among these dyes, particularly preferable are cyanine dyes, phthalocyanine dyes, oxonol dyes, squalirium dyes, pyrylium salts, thiopyrylium dyes, and nickel thiolate complexes. Dyes represented by the following general formulae (a) to (e) are also preferable since such dyes are excellent in terms of photothermal conversion efficiency. The cyanine dyes represented by the following general formula (a) are most preferable for the following reason: when the dyes are used in the photosensitive composition of the invention, the dyes manifest a high degree of interaction with the alkali-soluble resin, and the dyes are also excellent in terms of stability and economy.

General formula (a)

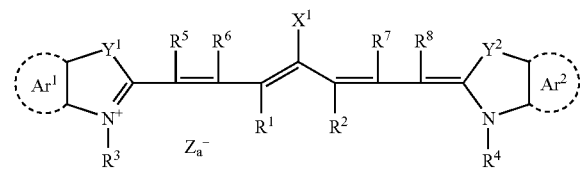

In general formula (a), $X^1$ represents a hydrogen atom, a halogen atom, —$NPh_2$, $X^2$—$L^1$ (wherein $X^2$ represents an oxygen atom or a sulfur atom, $L^1$ represents a hydrocarbon group having 1 to 12 carbon atoms, an aromatic cyclic group having a heteroatom, or a hydrocarbon group containing a heteroatom and having 1 to 12 carbon atoms, and the heteroatom referred to herein is N, S, O, a halogen atom, or Se), or a group represented by the following:

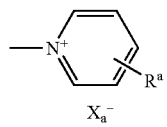

wherein $Xa^-$ has the same definition as $Za^-$, which will be described at a later time, and $R^a$ represents a substituent selected from a hydrogen atom, an alkyl group, an aryl group, a substituted or unsubstituted amino group, or a halogen atom;

$R^1$ and $R^2$ each independently represents a hydrocarbon group having 1 to 12 carbon atoms, and from the viewpoint of the storage stability of the photosensitive composition of the invention when it is used in a coating solution for forming a recording layer of a planographic printing plate precursor, it is preferable that $R^1$ and $R^2$ each independently represents a hydrocarbon group having 2 or more carbon atoms, and more preferably $R^1$ and $R^2$ are bonded to each other to form a 5-membered or 6-membered ring.

$Ar^1$ and $Ar^2$, which may be the same or different, each represent an aromatic hydrocarbon group which may have a substituent. Preferable examples of the aromatic hydrocarbon group include benzene and naphthalene rings. Preferable examples of the substituent include hydrocarbon groups having 12 or less carbon atoms, halogen atoms, and alkoxy groups having 12 or less carbon atoms.

$Y^1$ and $Y^2$, which may be the same or different, each represents a sulfur atom, or a dialkylmethylene group having 12 or less carbon atoms.

$R^3$ and $R^4$, which may be the same or different, each represents a hydrocarbon group which has 20 or less carbon atoms and may have a substituent. Preferable examples of the substituent include alkoxy groups having 12 or less carbon atoms, a carboxyl group, and a sulfo group. $R^5$, $R^6$, $R^7$ and $R^8$, which may be the same or different, each represents a hydrogen atom, or a hydrocarbon group having 12 or less carbon atoms, and since the raw materials thereof can easily be obtained, each preferably represents a hydrogen atom.

$Za^-$ represents a counter anion. However, in a case where the cyanine dye represented by general formula (a) has an anionic substituent in the structure thereof and there is accordingly no need to neutralize electric charges in the dye, $Za^-$ is not required. From the viewpoint of the storage stability of the recording layer coating solution, $Za^-$ is preferably an ion of a halogen, perchlorate, tetrafluroborate, hexafluorophosphate, carboxylate or sulfonate. From the viewpoints of compatibility of the dye with the alkali-soluble resin and solubility in the coating solution, $Za^-$ is preferably a halogen ion, or an organic acid ion such as a carboxylic acid ion or sulfonic acid ion, more preferably a sulfonic acid ion, and even more preferably an arylsulfonic acid ion.

Specific examples of the cyanine dye represented by general formula (a), and which can be preferably used in the invention, include dyes in JP-A No. 2001-133969 (paragraphs [0017] to [0019]), JP-A No. 2002-40638 (paragraphs [0012] to [0038]), and JP-A No. 2002-23360 (paragraphs [0012] to [0023]), as well as dyes illustrated below.

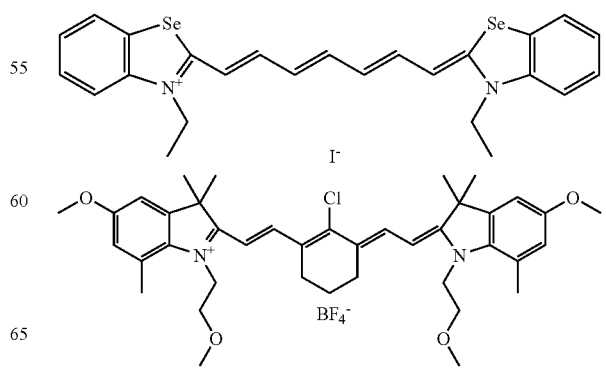

-continued

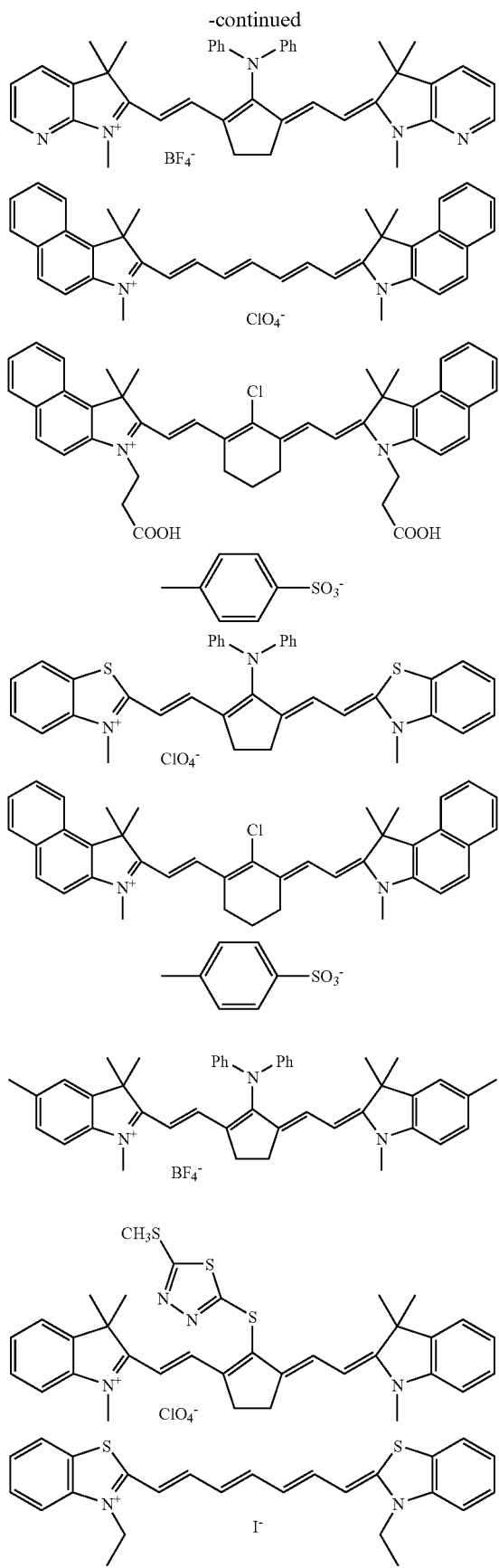

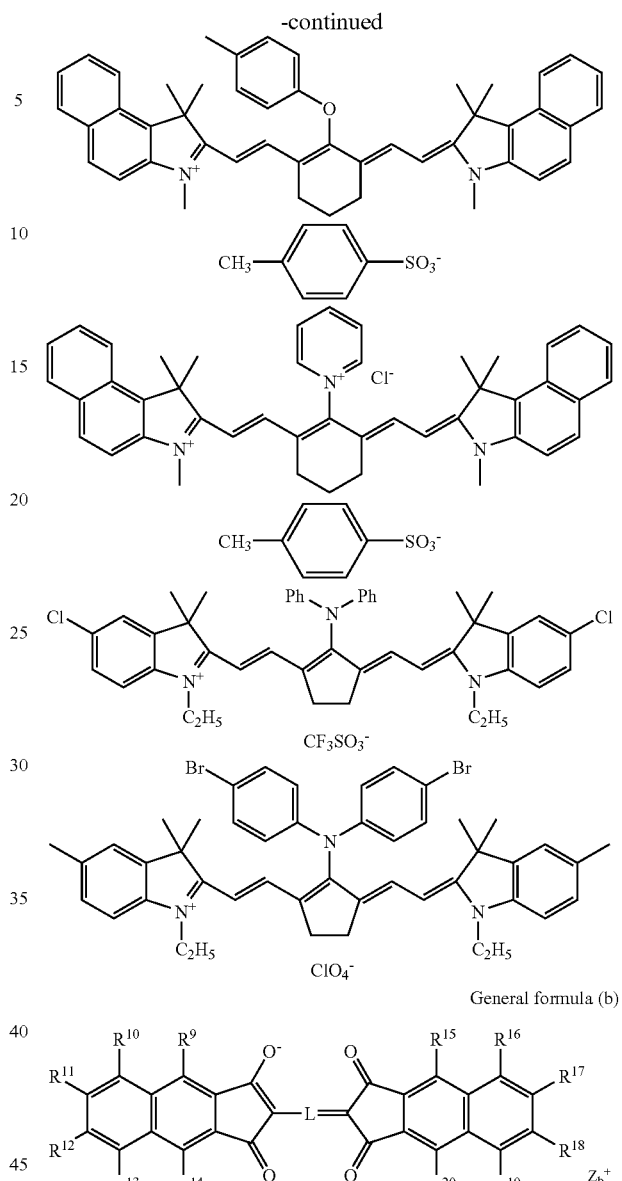

In general formula (b), L represents a methine chain having 7 or more conjugated carbon atoms, and the methine chain may have one or more substituent. The substituents may be bonded to each other to form a cyclic structure. $Z_b^+$ represents a counter cation. Preferable examples of the counter cation include ammonium, iodonium, sulfonium, phosphonium and pyridinium ions, and alkali metal cations (such as $Ni^+$, $K^+$ and $Li^+$).

$R^9$ to $R^{14}$ and $R^{15}$ to $R^{20}$ each independently represents a substituent selected from hydrogen atom, halogen atom, and cyano, alkyl, aryl, alkenyl, alkynyl, carbonyl, thio, sulfonyl, sulfinyl, oxy and amino groups; or a substituent obtained by combining two or three from among these substituents. Two or three out of $R^9$ to $R^{14}$ and $R^{15}$ to $R^{20}$ may be bonded to each other to form a cyclic structure.

A dye wherein L in general formula (b) represents a methine chain having 7 conjugated carbon atoms, and each of $R^9$ to $R^{14}$ and $R^{15}$ to $R^{20}$ represents a hydrogen atom, is preferable since such a dye can be easily obtained and exhibits advantageous effects.

Specific examples of the dye represented by general formula (b), and which can be preferably used in the invention, are illustrated below.

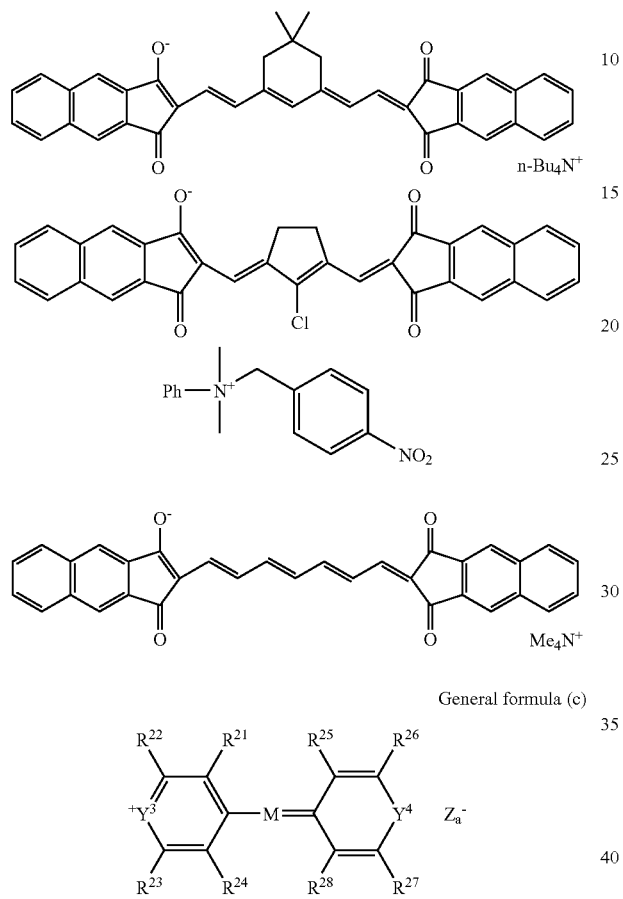

In general formula (c), $Y^3$ and $Y^4$ each independently represent an oxygen, sulfur, selenium or tellurium atom; M represents a methine chain having 5 or more conjugated carbon atoms; $R^{21}$ to $R^{24}$ and $R^{25}$ to $R^{28}$, which may be the same or different, each represents a hydrogen or halogen atom, or a cyano, alkyl, aryl, alkenyl, alkynyl, carbonyl, thio, sulfonyl, sulfinyl, oxy or amino group; and $Za^-$ represents a counter anion, and has the same meaning as $Za^-$ in general formula (a).

Specific examples of the dye which is represented by general formula (c) and which can be preferably used in the invention, are illustrated below.

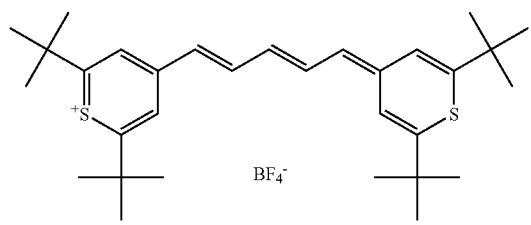

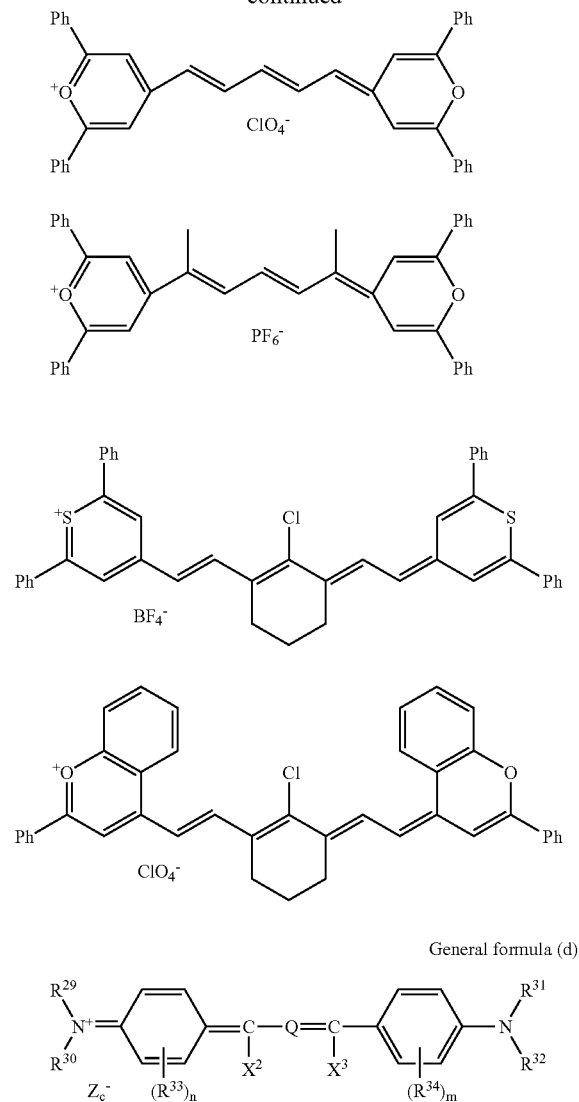

In general formula (d), $R^{29}$ to $R^{31}$ each independently represents a hydrogen atom, an alkyl group or an aryl group; $R^{33}$ and $R^{34}$ each independently represents an alkyl group, a substituted oxy group, or a halogen atom; n and m each independently represents an integer of 0 to 4; and $R^{29}$ and $R^{30}$, or $R^{31}$ and $R^{32}$ may be bonded to each other to form a ring, or $R^{29}$ and/or $R^{30}$ may be bonded to $R^{33}$ to form a ring and $R^{31}$ and/or $R^{32}$ may be bonded to $R^{34}$ to form a ring. When plural $R^{33}$'s and $R^{34}$'s are present, $R^{33}$'s may be bonded to each other to form a ring, or $R^{34}$'s may be bonded to each other to form a ring.

$X^2$ and $X^3$ each independently represents a hydrogen atom, an alkyl group or an aryl group, and at least one of $X^2$ and $X^3$ represents a hydrogen atom or an alkyl group.

Q represents a trimethine group or a pentamethine group which may have a substituent, and may be combined with an bivalent organic group to form a cyclic structure. $Zc^-$ represents a counter anion and has the same meanings as $Za^-$ in general formula (a).

Specific examples of the dye represented by general formula (d) and which can be preferably used in the invention, are illustrated below.

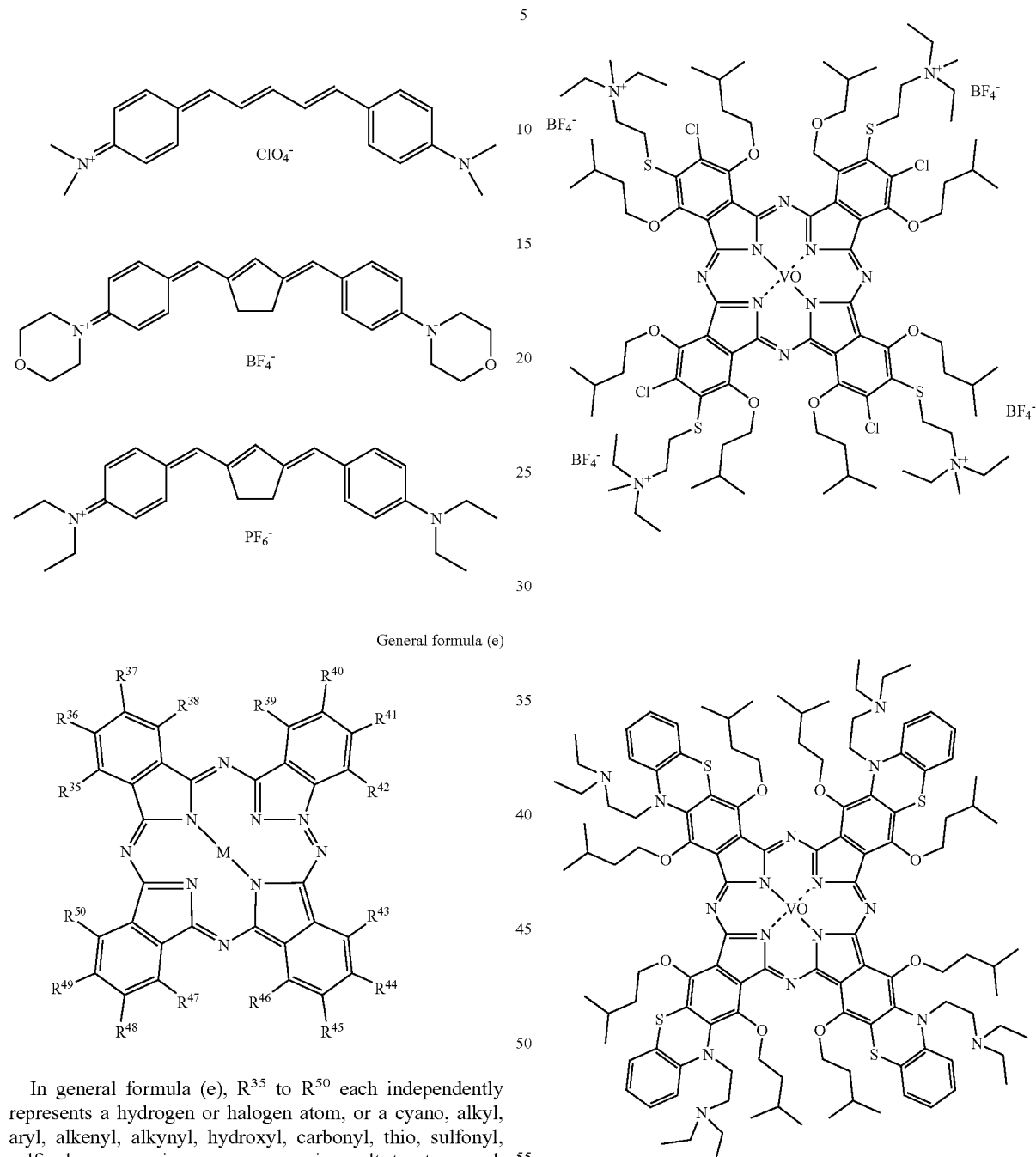

In general formula (e), $R^{35}$ to $R^{50}$ each independently represents a hydrogen or halogen atom, or a cyano, alkyl, aryl, alkenyl, alkynyl, hydroxyl, carbonyl, thio, sulfonyl, sulfinyl, oxy or amino group, or an onium salt structure, each of which may have a substituent; M represents two hydrogen atoms, a metal atom, a halo metal group, or an oxy metal group. Examples of the metal contained therein include atoms in IA, IIA, IIIB and IVB groups in the periodic table, transition metals in the first, second and third periods therein, and lanthanoid elements. Among these examples, preferable are copper, magnesium, iron, zinc, cobalt, aluminum, titanium, and vanadium.

Specific examples of the dye represented by general formula (e) and which can be preferably used in the invention, are illustrated below.

The pigment used as the infrared absorbent in the invention may be a commercially available pigment or a pigment described in publications such as Color Index (C.I.) Handbook, "Latest Pigment Handbook" (edited by Japan Pigment Technique Association, and published in 1977), "Latest Pigment Applied Technique" (by CMC Publishing Co., Ltd. in 1986), and "Printing Ink Technique" (by CMC Publishing Co., Ltd. in 1984).

Examples of the pigment include black pigments, yellow pigments, orange pigments, brown pigments, red pigments, purple pigments, blue pigments, green pigments, fluorescent pigments, metal powder pigments, and polymer-bonded dyes. Specifically, the following can be used: insoluble azo pigments, azo lake pigments, condensed azo pigments, chelate azo pigments, phthalocyanine pigments, anthraquinone pigments, perylene and perynone pigments, thioindigo pigments, quinacridone pigments, dioxazine pigments, isoindolinone pigments, quinophthalone pigments, dyeing lake pigments, azine pigments, nitroso pigments, nitro pigments, natural pigments, fluorescent pigments, inorganic pigments, and carbon black. Among these pigments, carbon black is preferable.

These pigments may be used with or without surface treatment. Examples of surface treatment include a method of coating the surface of the pigments with resin or wax; a method of adhering a surfactant onto the surface; and a method of bonding a reactive material (such as a silane coupling agent, an epoxy compound, or a polyisocyanate) to the pigment surface. The surface treatment methods are described in "Nature and Application of Metal Soap" (Saiwai Shobo), "Printing Ink Technique" (by CMC Publishing Co., Ltd. in 1984). And "Latest Pigment Applied Technique" (by CMC Publishing Co., Ltd. in 1986.

The particle size of the pigment is preferably from 0.01 to 10 μm, more preferably from 0.05 to 1 μm, and even more preferably from 0.1 to 1 μm. When a particle size is within the preferable range, a superior dispersion stability of the pigment in the photosensitive composition can be obtained, whereby, when the photosensitive composition of the invention is used for a recording layer of the photosensitive printing plate precursor, it is possible to form a homogeneous recording layer.

The method for dispersing the pigment may be a known dispersing technique used to produce ink or toner. Examples of a dispersing machine, which can be used, include an ultrasonic disperser, a sand mill, an attriter, a pearl mill, a super mill, a ball mill, an impeller, a disperser, a KD mill, a colloid mill, a dynatron, a three-roll mill, and a pressing kneader. Details are described in "Latest Pigment Applied Technique" (by CMC Publishing Co., Ltd. in 1986).

From the viewpoints of sensitivity, uniformity of the film to be formed and durability, the pigment or dye can be added to the photosensitive composition in a ratio of 0.01 to 50%, preferably 0.1 to 10%, and more preferably 0.5 to 10% (in the case of the dye) or 0.1 to 10% (in the case of pigment) by mass, relative to the total solid contents which constitute the photosensitive composition.

[Alkali-soluble Resin (C)]

In the invention, it is preferable to use an alkali-soluble resin (C) together with the essential components. Alkali-soluble resin (C) used in the invention may be any resin that is insoluble in water and soluble in an alkali. Examples include homopolymers each containing, in the main chain and/or in a side chain thereof, an acidic group; copolymers thereof; and mixtures thereof. The acidic group may be introduced into the resin by any one of a method of polymerizing a monomer which already has the acidic group, a method of causing the acidic group to react with a polymer which has been obtained though polymerization, and a method of combining the two methods.

Various alkali-soluble resins can be used in the invention and there are no particular restrictions. Examples thereof include various alkali-soluble polymer compounds such as phenol resins, polyhydroxystyrene, polyhydroxystyrene halide, N-(4-hydroxyphenyl)methacrylamide copolymer, and hydroquinone monomethacrylate copolymer, described in "Phenol Resin" published by Plastic Age Kabushiki Kaisha, "Synthesizing, Curing, Strengthening and Applying of Phenol Resin" published by Industrial Publishing & Consulting Inc., "Plastic Material Lecture (15) Phenol Resin" published by Nikkan Kogyo Shimbun, Ltd. And "Plastic Compendium (15) Phenol Resin" published by Kogyo Chosakai Publishing Co., Ltd.; sulfonylimide based polymers described in JP-A No. 7-28244; carboxyl-containing polymers described in JP-A No. 7-36184; acrylic resins which contain a phenolic hydroxyl group, as disclosed in JP-A No. 51-34711; acrylic resins which have a sulfonamide group and urethane resins, described in JP-A No. 2-866.

From the viewpoints of solubility in an alkaline developer and expression of an ability to suppress dissolution in the solution, resins having, in the main chain and/or a side chain thereof, one or more acidic groups selected from the aforementioned acidic groups (1) to (6) described above as alkali-soluble groups are preferable.

Among the alkali-soluble resins having one or more acidic groups selected from the items (1) to (6), from the viewpoints of solubility in alkaline developer, development latitude, and securance of an adequate film strength, in the invention, an alkali-soluble resin having a phenolic hydroxyl group, as in item (1), (phenol resin) is most preferable.

Specific examples of the phenol resin used in the invention include Novolak resin, resol resin, polyvinyl phenol resin, and acrylic resin having phenolic hydroxyl groups. Among these resins, Novolak resin, resol resin, polyvinyl phenol resin are preferable from the viewpoints of image-formability and thermosetting properties. Novolak resin and polyvinyl phenol resin are more preferable from the viewpoint of stability, and Novolak resin is even more preferable since the raw materials thereof can be readily obtained and the resin can be widely used.

Novolak resin is a resin obtained by polycondensing at least one selected from phenol compounds such as phenol, o-cresol, m-cresol, p-cresol, 2,5-xylenol, 3,5-xylenol, o-ethylphenol, m-ethylphenol, p-ethylphenol, propylphenol, n-butylphenol, tert-butylphenol, 1-naphthol, 2-naphthol, pyrocatechol, resorcinol, hydroquinone, pyrogallol, 1,2,4-benzenetriol, phloroglucinol, 4,4'-biphenyldiol, and 2,2-bis (4'-hydroxyphenyl)propane, with at least one selected from aldehydes (such as formaldehyde, acetoaldehyde, propionaldehyde, benzaldehyde, furfural, paraformaldehyde and paraaldehyde), and/or ketones (such as acetone, methyl ethyl ketone, and methyl isobutyl ketone), in the presence of an acidic catalyst.

In the invention, the phenol resin is preferably a polycondensate made from phenol, o-cresol, m-cresol, p-cresol, 2,5-xylenol, 3,5-xylenol or resorcinol as the phenol compound and formaldehyde, acetoaldehyde or propionaldehyde as the aldehyde or ketone, and is particularly preferably a polycondensate made from formaldehyde and mixed phenol compounds made of m-cresol/p-creson/2,5-xylenol/3,5-xylenol/resorcinol (mole ratio therebetween=40–100/0–50/0–20/0–20/0–20) or mixed phenol compounds made of phenol/m-cresol/p-cresol (mole ratio therebetween=0–100/0–70/0–60).

The photosensitive composition of the invention preferably contains a dissolution suppresser, which will be described later. Preferable, in this case, is a polycondensate made from formaldehyde and mixed phenol compounds made of m-cresol/p-creson/2,5-xylenol/3,5-xylenol/resorcinol (mole ratio therebetween=70–100/0–30/0–20/0–20/0–20) or mixed phenol compounds made of phenol/m- cresol/p-cresol (mole ratio therebetween=10–100/0–60/0–40). From the viewpoint of sensitivity, it is more preferable to use a specific polymerizable polymer having an acid value of less than 2.0 mmol/g (preferably, less than 1.75 mmol/g) in combination with a polycondensate made from formaldehyde and mixed phenol compounds made of phenol/m-cresol/p-cresol (mole ratio therebetween=20–80/0–60/0–40). It is most preferable to use a specific polymerizable polymer in combination with a polycondensate made from formaldehyde and mixed phenol compounds made of phenol/m-cresol/p-cresol (mole ratio therebetween=20–45/0–60/0–40).

The weight average molecular weight of the above-mentioned Novolak resin in terms of polystyrene on the basis of measurement by a gel permeation chromatograph (hereinafter referred to merely as "the weight average molecular weight") is preferably from 500 to 20,000, more preferably from 1,000 to 15,000, and even more preferably from 3,000 to 12,000. When the weight average molecular weight is within this range, film-formability of the resin is adequate and alkali-developability of unexposed portions made of the resin is excellent.

These alkali-soluble resins may be used either alone or in combination of two or more thereof.

When the photosensitive composition of the invention is used as a recording layer of a planographic printing plate precursor, in order to improve film-formability of the composition and the resistance against alkali development, the content by percentage of alkali-soluble resin (C), relative to the total solid contents of the photosensitive composition is preferably from 0 to 80% by mass, and more preferably from 10 to 50% by mass.

[Other Components]

When the photosensitive composition of the invention is prepared, various additives may if necessary be added. In order to enhance the capacity for suppressing the dissolution into the developer of image portions made of the composition, it is particularly preferable to add a substance, such as an onium salt, o-quinonediazide compound or an alkyl sulfonate which is thermally decomposable and lowers substantially the solubility of the alkali-soluble resin when not dissolved (i.e., a decomposable dissolution suppresser).

Preferable examples of the decomposable dissolution suppresser include onium salts such as diazonium, iodonium, sulfonium, and ammonium salts; and o-quinonediazide compounds. The diazonium, iodonium, and sulfonium salts are more preferable, and the diazonium salt is even more preferable.

Preferable examples of the onium salt used in the invention include diazonium salts described in S. I. Schlesinger, Photogr. Sci. Eng., 18, 387 (1974), T. S. Bal et al., Polymer, 21, 423 (1980), and JP-A No. 5-158230; ammonium salts described in U.S. Pat. Nos. 4,069,055 and 4,069,056, and JP-A No. 3-140140; phosphonium salts described in D.C. Necker et al., Macromolecules, 17, 2468 (1984), C. S. Wen et al., Teh, Proc. Conf. Rad. Curing ASIA, p478 Tokyo, October (1988), and U.S. Pat. Nos. 4,069,055 and 4,069,056; iodonium salts described in J. V. Crivello et al., Macromolecules, 10 (6), 1307 (1977), Chem. & Eng. News, November 28, p31 (1988), EP No. 104,143, U.S. Pat. Nos. 5,041,358 and 4,491,628, and JP-A Nos. 2-150848 and 2-296514; sulfonium salts described in J. V. Crivello et al., Polymer J. 17, 73 (1985), J. V. Crivello et al., J. Org. Chem., 43, 3055 (1978), W. R. Watt et al., J. Polymer Sci., Polymer Chem. Ed., 22, 1789 (1984), J. V. Crivello et al., Polymer Bull., 14, 279 (1985), J. V. Crivello et al., Macromolecules, 14 (5), 1141 (1981), J. V. Crivello et al., J. Polymer Sci., Polymer Chem. Ed., 17, 2877 (1979), EP Nos. 370,693, 233,567, 297,443 and 297,442, U.S. Pat. Nos. 4,933,377, 3,902,114, 5,041,358, 4,491,628, 4,760,013, 4,734,444 and 2,833,827, and DE Patent Nos. 2,904,626, 3,604,580 and 3,604,581; selenonium salts described in J. V. Crivello et al., Macromolecules, 10 (6), 1307 (1977), J. V. Crivello et al., J. Polymer Sci., Polymer Chem. Ed., 17, 1047 (1979); arsonium salts described in C. S. Wen et al., and The Proc. Conf. Rad. Curing ASIA, p478, Tokyo, October (1988).

Among such onium salts, diazonium salts are particularly preferable from the viewpoints of both their capacity of hindering dissolution, and their thermal decomposability. The diazonium salts represented by general formula (I) in the JP-A No. 5-158230 and the diazonium salts represented by general formula (1) in JP-A No. 11-143064 are more preferable, and diazonium salts represented by general formula (1) in the JP-A No. 11-143064, which have low absorption wavelength peaks within the visible ray range, are most preferable.

Examples of the counter ion of the onium salt include tetrafluoroboric acid, hexafluorophosphoric acid, triisopropylnaphthalenesulfonic acid, 5-nitro-o-toluenesulfonic acid, 5-sulfosalicylic acid, 2,5-dimethylbenzenesulfonic acid, 2,4,6-trimethylbenzenesulfonic acid, 2-nitrobenzenesulfonic acid, 3-chlorobenzenesulfonic acid, 3-bromobenzenesulfonic acid, 2-fluorocaprylnaphthalenesulfonic acid, dodecylbenzenesulfonic acid, 1-naphthol-5-sulfonic acid, 2-methoxy-4-hydroxy-5-benzoyl-benzenesulfonic acid, and p-toluenesulfonic acid. Among these examples, hexafluorophosphoric acid, and alkylaromatic sulfonic acids such as triisopropylnaphthalenesulfonic acid and 2,5-dimethylbezenesulfonic acid are particularly preferable.

The quinonediazide is preferably an o-quinonediazide compound. The o-quinonediazide compound used in the invention is a compound having at least one o-quinonediazide group and having an alkali-solubility increased by being thermally decomposed. The compound may be any one of compounds having various structures.

In other words, the o-quinonediazide compound assists the solubility of the photosensitive material both from the viewpoint of the effects of being thermally decomposed, and thereby losing the function of suppressing the dissolution of the binder, and the effect that the o-quinonediazide itself is changed into an alkali-soluble material.

Preferable examples of the o-quinonediazide compound used in the invention include compounds described in J. Coser, "Light-Sensitive Systems" (John Wiley & Sons. Inc.), pp. 339–352. Particularly preferable are sulfonic acid esters or sulfonamides of o-quinonediazide made to react with various aromatic polyhydroxy compounds or with aromatic amino compounds.

Further preferable examples include an ester made from benzoquinone-(1,2)-diazidesulfonic acid chloride or naphthoquinone-(1,2)-diazide-5-sulfonic acid chloride and pyrogallol-acetone resin, as described in JP-B No. 43-28403; and an ester made from benzoquinone-(1,2)-diazidesulfonic acid chloride or naphthoquinone-(1,2)-diazide-5-sulfonic acid chloride and phenol-formaldehyde resin.

Additional preferable examples include an ester made from naphthoquinone-(1,2)-diazide-4-sulfonic acid chloride and phenol-formaldehyde resin or cresol-formaldehyde resin; and an ester made from naphthoquinone-(1,2)-diazide-4-sulfonic acid chloride and pyrogallol-acetone resin.

Other useful o-quinonediazide compounds are reported in unexamined or examined patent documents, examples of which include JP-A Nos. 47-5303, 48-63802, 48-63803, 48-96575, 49-38701 and 48-13354, JP-B No. 41-11222, 45-9610 and 49-17481, U.S. Pat. Nos. 2,797,213, 3,454,400, 3,544,323, 3,573,917, 3,674,495 and 3,785,825, GB Patent Nos. 1,227,602, 1,251,345, 1,267,005, 1,329,888 and 1,330,932, and DE Patent No. 854,890.

When the photosensitive composition of the invention is used as a recording layer of a planographic printing plate precursor, the amount of onium salt and/or o-quinonediazide compound added as the decomposable dissolution suppresser(s) is preferably from 0.1 to 10%, more preferably from 0.1 to 5%, and even more preferably from 0.2 to 2% by relative to the total solid contents of the recording layer. The onium salts and the o-quinonediazide compounds may be used either independently or in the form of mixtures of two or more thereof.

The amount of additives other than the o-quinonediazide compound added is preferably from 0 to 5%, more preferably from 0 to 2%, and even more preferably from 0.1 to 1.5% by mass. The additives and the binder used in the invention are preferably incorporated into the same layer.

A dissolution suppresser having no decomposability may be used in combination. Preferable examples thereof include sulfonic acid esters, phosphoric acid esters, aromatic carboxylic acid esters, aromatic disulfones, carboxylic acid anhydrides, aromatic ketones, aromatic aldehydes, aromatic amines, and aromatic ethers, details of which are described in JP-A No. 10-268512; acidic color-developable dyes which have a lactone skeleton, an N,N-diarylamide skeleton or a diarylmethylimino skeleton and also function as a coloring agent, details of which are described in JP-A No. 11-190903; and nonionic surfactants described, details of which are described in JP-A No. 2000-105454.

In order to strengthen discrimination of images to be obtained (discrimination of hydrophobicity and hydrophilicity), or to improve the resistance of the surface against scratches, the following also may be used: a polymer containing, as a polymerization component, a (meth)acrylic monomer having in the 2 or 3 perfluoroalkyl groups having 3 to 20 carbon atoms. When the photosensitive composition of the invention is used as a recording layer of a planographic printing plate precursor, in relation to the total solid contents of the recording layer, the amount of this compound added is preferably from 0.1 to 10%, and more preferably from 0.5 to 5% by mass.

In order to provide the photosensitive composition of the invention with resistance against scaratches, a compound for lowering the static friction coefficient of the surface may be added to the composition. Specific examples thereof include long-chain alkyl carboxylic acid esters as described in U.S. Pat. No. 6,117,913. When the photosensitive composition of the invention is used as a recording layer of a planographic printing plate precursor, in relation to the total solid contents of the recording layer, the amount of such a compound added is preferably from 0.1 to 10%, and more preferably from 0.5 to 5% by mass.

The photosensitive composition of the invention may, whenever necessary, contain a compound having an acidic group of low-molecular weight. Examples of such an acidic group include sulfonic acid, carboxylic acid and phosphoric acid groups. Compounds having a sulfonic acid group are particularly preferable. Specific examples include aromatic sulfonic acids and aliphatic sulfonic acids such as p-toluenesulfonic acid and naphthalenesulfonic acid.

In order to enhance sensitivity, the photosensitive composition may also contain a cyclic acid anhydride, a phenolic compound, or an organic acid.

Examples of cyclic acid anhydride include phthalic anhydride, tetrahydrophthalic anhydride, hexahydrophthalic anhydride, 3,6-endooxy-Δ4-tetrahydrophthalic anhydride, tetrachlorophthalic anhydride, maleic anhydride, chloromaleic anhydride, α-phenylmaleic anhydride, succinic anhydride, and pyromellitic anhydride which are described in U.S. Pat. No. 4,115,128.

Examples of phenolic compound include bisphenol A, p-nitrophenol, p-ethoxyphenol, 2,4,4'-trihydroxybenzophenone, 2,3,4-trihydroxybenzophenone, 4-hydroxybenzophenone, 4,4',4"-trihydroxytriphenylmethane, 4,4',3",4"-tetrahydroxy-3,5,3',5'-tetramethyltriphenylmethane.

Examples of the organic acid include sulfonic acids, sulfinic acids, alkylsulfuric acids, phosphonic acids, phosphates, and carboxylic acids, which are described in JP-A No. 60-88942 or 2-96755. Specific examples thereof include p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthalic acid, terephthalic acid, 4-cyclohexene-1,2-dicarboxylic acid, erucic acid, lauric acid, n-undecanoic acid, and ascorbic acid.

When the cyclic acid anhydride, the phenol or the organic acid is added to a recording layer of a planographic printing plate precursor, the ratio thereof in the recording layer is preferably from 0.05 to 20%, more preferably from 0.1 to 15%, and even more preferably from 0.1 to 10% by mass.

When the photosensitive composition according to the invention is used in a recording layer coating solution for a planographic printing plate precursor, in order to enhance stability in processes which affect conditions of developing, the following can be added: nonionic surfactants as described in JP-A Nos. 62-251740 and 3-208514; amphoteric surfactants as described in JP-A Nos. 59-121044 and 4-13149; siloxane compounds as described in EP No. 950517; and copolymers made from a fluorine-containing monomer as described in JP-A No. 11-288093.

Specific examples of nonionic surfactants include sorbitan tristearate, sorbitan monopalmitate, sorbitan trioleate, monoglyceride stearate, and polyoxyethylene nonyl phenyl ether. Specific examples of amphoteric surfactants include alkyldi(aminoethyl)glycine, alkylpolyaminoethylglycine hydrochloride, 2-alkyl-N-carboxyethyl-N-hydroxyethylimidazolinium betaine and N-tetradecyl-N,N'-betaine type surfactants (trade name: "Amolgen K", manufactured by Daiichi Kogyo Seiyaku Co., Ltd.).

The siloxane compounds are preferably block copolymers made from dimethylsiloxane and polyalkylene oxide. Specific examples thereof include polyalkylene oxide modified silicones (trade names: DBE-224, DBE-621, DBE-712, DBE-732, and DBE-534, manufactured by Chisso Corporation; trade name: Tego Glide 100, manufactured by Tego Co., Ltd.).

The content of the nonionic surfactant and/or the amphoteric surfactant in the photosensitive composition is preferably from 0.05 to 15% by mass, and more preferably from 0.1 to 5% by mass.

To the photosensitive composition of the invention may be added a printing-out agent for obtaining a visible image immediately after the photosensitive composition of the invention has been heated by exposure to light, or a dye or pigment as an image coloring agent.

A typical example of a printing-out agent is a combination of a compound which is heated by exposure to light, thereby emitting an acid (an optically acid-generating agent), and an organic dye which can form salts (salt formable organic dye).

Specific examples thereof include combinations of an o-naphthoquinonediazide-4-sulfonic acid halogenide with a salt-formable organic dye, described in JP-A Nos. 50-36209 and 53-8128; and combinations of a trihalomethyl compound with a salt-formable organic dye, described in each of JP-A Nos. 53-36223, 54-74728, 60-3626, 61-143748, 61-151644 and 63-58440.

The trihalomethyl compound is classified into an oxazol compound or a triazine compound. Both of the compounds provide excellent in stability over the passage of time and produce a vivid printed-out image.

As the image coloring agent, a dye different from the above-mentioned salt-formable organic dye may be used. Preferable examples of such a dye, and of the salt-formable organic dye, include oil-soluble dyes and basic dyes.

Specific examples thereof include Oil yellow # 101, Oil Yellow # 103, Oil Pink #312, Oil Green BG, Oil Blue BOS, Oil Blue #603, Oil Black BY, Oil Black BS, and Oil Black T-505 (each of which is manufactured by Orient Chemical Industries Ltd.); Victoria Pure Blue, Crystal Violet (CI42555), Methyl Violet (CI42535), Ethyl Violet, Rhodamine B (CI145170B), Malachite Green (CI42000), and Methylene Blue (CI52015).

Dyes described in JP-A No. 62-293247 are particularly preferable. These dyes may be added to the photosensitive composition at a ratio of 0.01 to 10% by mass, and preferably 0.1 to 3% by mass, relative to the total solid contents therein.

Whenever necessary, a plasticizer may be added to the photosensitive composition of the invention to give flexibility to a coating film made from the composition. Examples of the plasticizer include oligomers and polymers of butyl phthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl olete, and acrylic acid and methacrylic acid.

In addition to the above, the following may be appropriately added to the composition, depending on the objective: an epoxy compound; a vinyl ether; a phenol compound having a hydroxymethyl group and a phenol compound having an alkoxymethyl group, described in JP-A No. 8-276558; and a cross-linkable compound having an effect of suppressing dissolution in an alkali, described in JP-A No. 11-160860, and which was previously proposed by the present inventors.

Because the photosensitive composition of the invention obtained as described above is excellent in terms of film-formability and strength of the coating film to be formed, and can give a high alkali-solubility to exposed portions obtained from the composition when exposure is effected to the exposed portion by infrared rays, the composition can be used suitably for a recording layer of a infrared-ray-applicable positive type planographic printing plate precursor.

[Application of the Composition to a Planographic Printing Plate Precursor]

In a case where the photosensitive composition of the invention is applied to a recording layer of a planographic printing plate precursor, the photosensitive composition is dissolved in a solvent and the solution can be applied onto a suitable support to form the recording layer. A protective layer, a resin intermediate layer, a back coating layer and other layers, which will all be described later, may be formed depending on the objective.

Examples of the solvent in this case include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetoamide, N,N-dimethylformamide, tetramethylurea, N-methylpyrrolidone, dimethylsulfoxide, sulfolane, γ-butyrolactone, and toluene. However, the solvent is not limited thereto. Moreover, these solvents may be used alone, or in a mixture form.

The density of the components of the solvent mentioned above (the total of solid contents containing the additives) is preferably from 1 to 50% by mass.

In a case where the photosensitive composition of the invention is used as a recording layer of a planographic printing plate precursor, the recording layer may have a monolayer structure or a multilayer structure composed of two or more layers. In the case of a monolayer structure recording layer, the positive photosensitive composition of the invention may be used as the recording layer, as it is.

In the case of the multilayer structure, the photosensitive composition of the invention may be used as either the upper or the lower layer. However, from the viewpoint of image-formability, it is preferable to use the composition as the lower layer. In this case, a structure may be used wherein the polymer compound (A), which has in a side chain thereof a polymerizable or a cross-linkable group, is incorporated into the lower layer, and the infrared absorbent (B) is incorporated into the upper layer.

A preferable embodiment of the multilayer structure is an embodiment wherein polymer compound (A) is incorporated into the lower layer, which is positioned near a support, and wherein an alkali-soluble resin, preferably Novolak resin, and infrared absorbent (B) are incorporated into the upper layer.

Such a structure enables the upper layer, in particular unexposed portions thereof, to exhibit a high resistance against alkali development on the basis of the combination of infrared absorbent (B) with the Novolak resin, which can interact intensely with this absorbent. As a result, the upper layer functions as a development resistance layer for the lower layer. On the other hand, in exposed portions of the upper layer, the interaction as described above is easily counterbalanced, and exposed portions exhibit solubility in an alkali developer. Consequently, exposed portions are easily dissolved and removed together with polymer compound (A) which has in a side chain thereof either a polymerizable or cross-linkable group, containing the alkali-soluble group.

For this reason, a recording layer having this structure is superior in terms of development latitude. Moreover, when the recording layer is subjected to burning treatment after being developed, the polymerizable or cross-linkable groups of polymer compound (A) contained in only the unexposed portions of the lower layer undergo a polymerizing or cross-linking reaction with each other, and further undergo polymerizing or cross-linking reaction between the groups and the alkali-soluble resin present near the groups. Accordingly, the recording layer can achieve a remarkable improvement in printing resistance by means of the burning treatment.

The amount (solid content) of the recording layer applied on the support after the composition has been applied and dried varies depending on the application. In a case where the recording layer is a monolayer-type recording layer of a planographic printing plate precursor, the amount applied is preferably from 0.5 to 5.0 g/m$^2$. As the amount applied is reduced, apparent sensitivity increases but film properties of the photosensitive recording layer deteriorate.

In the case of a multilayer structure, the amount applied on the lower layer is preferably in the range of from 0.5 to 3.0 g/m$^2$, and more preferably from 0.6 to 2.5 g/m$^2$. The amount applied on the upper layer is preferably in the range of from 0.05 to 1.0 g/m$^2$, and more preferably from 0.08 to 0.7 g/m$^2$.

The total amount applied on the lower and upper layers after the layers have been dried is preferably from 0.6 to 4.0 g/m$^2$, and more preferably from 0.7 to 2.5 g/m$^2$.

Various methods may be used for the application. Examples thereof include bar coater coating, spin coating, spray coating, curtain coating, dip coating, air knife coating, blade coating and roll coating.

To a coating solution for the recording layer comprising the photosensitive composition of the invention may be added a surfactant for improving the applicability of the coating solution, for example, a fluorine-containing surfactant as described in JP-A No. 62-170950. The amount applied thereof is preferably from 0.01 to 1%, and more preferably from 0.05 to 0.5% by mass, relative to the total solid contents of the recording layer.

[Resin Intermediate Layer]

Whenever necessary, a resin intermediate layer may be formed between the support and the recording layer in the planographic printing plate precursor to which the photosensitive composition of the invention is applied.

This resin intermediate layer, which is made of a polymer, functions as a heat insulating layer. Thus, heat generated by exposing the precursor to an infrared laser does not diffuse into the support and is effectively used. Consequently, the planographic printing plate precursor has an advantage insofar the recording layer can attain a high degree of sensitivity. When this resin intermediate layer is formed, the recording layer is positioned so as a surface is exposed to light, or the recording layer is positioned near the surface, and the sensitivity to the infrared laser is thereby satisfactorily maintained.

In unexposed portions of the recording layer, the recording layer itself, which the alkali developer does not penetrate, functions as a protective layer for the resin intermediate layer. Accordingly, development stability of the printing plate precursor is secured to a satisfactory level and, in addition, images superior in discrimination are formed. Moreover, it is believed that over the passage of time of the images can be maintained.

On the other hand, in the exposed portions, components of the recording layer, the dissolution-suppressing function of which has been nullified, are speedily dissolved and dispersed into the developer, and, further, the resin intermediate layer, which is positioned adjacent to the support, is made mainly of an alkali-soluble resin. Accordingly, the exposed portions exhibit satisfactory solubility in the developer. Therefore, for example, even when a developer whose activity has been lowered is used, the intermediate resin layer is rapidly dissolved without leaving any portion of the layer remaining behind. This fact contributes to an improvement in the developability of the printing plate precursor, and in this way the resin intermediate layer is useful.

The resin intermediate layer is formed as a layer made mainly of alkali-soluble resin. In order to distinguish the boundary between the recording layer and the resin intermediate layer clear, it is preferable to use for the main component of the intermediate layer an alkali-soluble resin which is different from that used in the recording layer.

Preferable examples of the alkali-soluble resin used in the resin intermediate layer include alkali-soluble resins having units exhibiting high polarity, such as copolymer of N-(p-aminosulfonylphenyl) (meth)acrylamide, alkyl (meth)acrylate and acrylonitrile, copolymer of 4-maleimidebenzenesulfonamide, and styrene, and copolymer of (meth)acrylic acid, N-phenylmaleimide and (meth)acrylamide. However, the alkali-soluble resin is not limited thereto.

[Support]

The support used in the planographic printing plate precursor is a plate having dimensional stability. A plate satisfying required physical properties such as strength and flexibility can be used without any restriction. Examples thereof include paper, plastic (such as polyethylene, polypropylene or polystyrene)-laminated papers, metal plates (such as aluminum, zinc and copper plates), plastic films (such as cellulose biacetate, cellulose triacetate, cellulose propionate, cellulose lactate, cellulose acetate lactate, cellulose nitrate, polyethylene terephthalate, polyethylene, polystyrene, polypropylene, polycarbonate, and polyvinyl acetate films), and papers or plastic films on which, as described above, a metal is laminated or vapor-deposited.

The support is preferably a polyester film or an aluminum plate, and more preferably an aluminum plate, since an aluminum plate is superior in terms of dimensional stability and is also relatively inexpensive.

Preferable examples of the aluminum plate include a pure aluminum plate and alloy plates made of aluminum as a main component with a very small amount of other elements. A plastic film on which aluminum is laminated or vapor-deposited may also be used.

Examples of other elements contained in the aluminum alloys include silicon, iron, manganese, copper, magnesium, chromium, zinc, bismuth, nickel, and titanium. The content by percentage of different elements in the alloy is at most 10% by mass. A particularly preferable aluminum plate in the invention is pure aluminum plate; however, since from the viewpoint of refining a completely pure aluminum cannot be easily produced, a very small amount of other elements may also be contained in the plate.

The aluminum plate used as the support is not specified in terms of the composition thereof. Thus, aluminum plates which are conventionally known can be appropriately used. The thickness of the aluminum plate used in the invention is from about 0.1 to 0.6 mm, preferably from 0.15 to 0.4 mm, and more preferably from 0.2 to 0.3 mm.

If necessary, prior to the surface-roughening treatment, the aluminum plate may optionally be subjected to degreasing treatment, in order to remove rolling oil or the like on the surface, with a surfactant, an organic solvent, an aqueous alkaline solution or the like.

The surface-roughening treatment of the aluminum surface can be performed by various methods such as a mechanical surface-roughening method, a method of dissolving and roughening the surface electrochemically, and a method of dissolving the surface selectively in a chemical manner.

Mechanical surface-roughening methods which can be used may be known methods, such as a ball polishing method, a brush polishing method, a blast polishing method or a buff polishing method. An electrochemical surface-roughening method may be a method of performing surface-roughening in an electrolyte of hydrochloric acid or nitric acid, by use of an alternating current or a direct current. As disclosed in JP-A No. 54-63902, a combination of the two kinds of methods may be used.

An aluminum plate whose surface is roughened as described above is if necessary subjected to alkali-etching treatment and neutralizing treatment. Thereafter, an anodizing treatment is optionally applied in order to improve the water holding capacity and wear resistance of the surface.

The electrolyte used in the anodizing treatment of the aluminum plate is any one selected from various electrolytes which can form a porous oxide film. Among which in general use are electrolytes of sulfuric acid, phosphoric acid, oxalic acid, chromic acid, or a mixed acid thereof. The concentration of the electrolyte may be appropriately decided depending on the kind of electrolyte selected.

Treatment conditions for anodization cannot be specified as a general rule since conditions vary depending on the electrolyte used; however, the following range of conditions are generally suitable: an electrolyte concentration of 1 to 80% by mass, a solution temperature of 5 to 70° C., a current density of 5 to 60 $A/dm^2$, a voltage of 1 to 100 V, and an electrolyzing time of 10 seconds to 5 minutes. If the amount of anodic oxide film is less than 1.0 $g/m^2$, printing resistance is inadequate or non-image portions of the planographic printing plate tend to become easily damaged and the so-called "blemish stains", resulting from ink adhering to damaged portions at the time of printing, are easily generated.

After the anodizing treatment, the surface of the aluminum is if necessary subjected to treatment for obtaining hydrophilicity. This securance of hydrophilicity treatment may be an alkali metal silicate (for example, an aqueous sodium silicate solution) method, as disclosed in U.S. Pat. Nos. 2,714,066, 3,181,461, 3,280,734, and 3,902,734. In this method, the support is subjected to an immersing treatment or an electrolyzing treatment with an aqueous sodium silicate solution.

In addition, the following methods may also be used: a method of treating the support with potassium fluorozirconate, as disclosed in JP-B No. 36-22063, or with polyvinyl phosphonic acid, as disclosed in U.S. Pat. Nos. 3,276,868, 4,153,461, and 4,689,272.

The planographic printing plate precursor to which the invention is applied is a precursor wherein a positive type recording layer is formed on a support. If necessary, an undercoat layer may be formed therebetween.

As components of the undercoat layer, various organic compounds can be used. Examples thereof include carboxymethylcellulose, dextrin, gum arabic, phosphonic acids having an amino group, such as 2-aminoethylphosphonic acid, organic phosphonic acids which may have a substituent, such as phenyl phosphonic acid, naphthylphosphonic acid, alkylphosphonic acid, glycerophosphonic acid, methylenediphosphonic acid and ethylenediphosphonic acid, organic phosphoric acids which may have a substituent, such as phenylphosphoric acid, naphthylphosphoric acid, alkylphosphoric acid and glycerophosphoric acid, organic phosphinic acids which may have a substituent, such as phenylphosphinic acid, naphthylphosphinic acid, alkylphosphinic acid and glycerophosphinic acid, amino acids such as glycine and β-alanine, and hydrochlorides of amines having a hydroxyl group, such as a hydrochloride of triethanolamine. These organic compounds may be used alone or in the form of a mixture made up of two or more thereof.

This organic undercoat layer may be formed by methods which can be described as follows: a method of applying onto the aluminum plate a solution wherein the above-mentioned organic compound is dissolved in water, or an organic solvent such as methanol, ethanol or methyl ethyl ketone, or a mixed solvent thereof and then drying the resultant aluminum plate, or a method of immersing the aluminum plate into a solution wherein the above-mentioned organic compound is dissolved in water, or an organic solvent such as methanol, ethanol or methyl ethyl ketone, or a mixed solvent thereof so as to adsorb the compound, washing the aluminum plate with water or the like, and then drying the resultant aluminum plate.

In the former method, the solution of the organic compound having a concentration of 0.05 to 10% by mass may be applied in various ways. In the latter method, the concentration of the organic compound in the solution is from 0.01 to 20%, preferably from 0.05 to 5%, the temperature for the immersion is from 20 to 90° C., preferably from 25 to 50° C., and the time taken for immersion is from 0.1 second to 20 minutes, preferably from 2 seconds to 1 minute.

The pH of the solution used in the above-mentioned methods can be adjusted into a range of 1 to 12 with a basic material such as ammonia, triethylamine or potassium hydroxide, or an acidic material such as hydrochloric acid or phosphoric acid. Moreover, a yellow dye may be added to the solution, in order to improve the tone reproducibility of the recording layer.

The amount of organic undercoat layer applied is suitably from 2 to 200 $mg/m^2$, preferably from 5 to 100 $mg/m^2$. If the amount applied is less than 2 $mg/m^2$, adequate printing resistance cannot be obtained. Moreover, if the amount applied is more than 200 $mg/m^2$, in the same way, adequate printing resistance cannot be obtained.

The positive type planographic printing plate precursor produced as described above is normally imagewise exposed to light, and then subjected to developing treatment.

The light source used for the normally image-exposure is preferably a light source having an emission wavelength within a range from near infrared wavelengths to infrared ray wavelengths, and more preferably is a solid laser or a semiconductor laser.

As the developer and replenisher for the planographic printing plate precursor wherein the photosensitive composition of the invention is used as its recording layer, aqueous solutions of a conventional alkali agent can be used.

Examples of the alkali agent include inorganic alkali salts such as sodium silicate, potassium silicate, trisodium phosphate, tripotassium phosphate, triammonium phosphate, disodium hydrogenphosphate, dipotassium hydrogenphosphate, diammonium hydrogenphosphate, sodium carbonate, potassium carbonate, ammonium carbonate, sodium hydrogencarbonate, potassium hydrogencarbonate, ammonium hydrogen carbonate, sodium borate, potassium borate, ammonium borate, sodium hydroxide, ammonium hydroxide, potassium hydroxide and lithium hydroxide; and organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, and pyridine. These alkali agents may be used alone or in combinations of two or more thereof.

Among these alkali agents, silicates such as sodium silicate and potassium silicate are particularly preferable for the developer. This is because the developing capacity of the developer can be controlled by adjusting the ratio between silicon oxide ($SiO_2$) and alkali metal oxide ($M_2O$), which are components of any one of the silicates, and by adjusting the concentrations thereof. For example, alkali metal silicates as described in JP-A No. 54-62004 or JP-B No. 57-7427 can be effectively used.

In a case where an automatic developing machine is used to perform development, an aqueous solution having a higher alkali intensity than that of the developer (or, replenisher) can be added to the developer. It is known that this makes it possible to treat a great number of photosensitive plates without recourse to replacing the developer in the developing tank over a long period of time. This replenishing manner is also preferably used in the invention.

If necessary, various surfactants or organic solvents can be incorporated into the developer and the replenisher in order to promote and suppress development capacity, disperse development scum, and enhance the ink-affinity of image portions of the printing plate.

Preferable examples of the surfactant include anionic, cationic, nonionic and amphoteric surfactants. If necessary, the following may be added to the developer and the replenisher: a reducing agent (such as hydroquinone, resorcin, a sodium or potassium salt of an inorganic acid such as sulfurous acid or hydrogen sulfite acid), an organic carboxylic acid, an antifoaming agent, and a water softener.

The printing plate developed with the developer and replenisher described above is subsequently subjected to treatments with washing water, a rinse solution containing a surfactant and other components, and a desensitizing solution containing gum arabic and a starch derivative. For after treatment following use of the photosensitive composition of the invention as a planographic printing plate precursor, various combinations of these treatments may be employed.

In recent years, automatic developing machines for printing plate precursors have been widely used in order to rationalize and standardize plate-making processes in the plate-making and printing industries. These automatic developing machines are generally made up of a developing section and a post-processing section, and include a device for carrying printing plate precursors, various treating solution tanks, and spray devices. These machines are machines for spraying respective treating solutions, which are pumped up, onto an exposed printing plate through spray nozzles, for development, while the printing plate is transported horizontally.

Recently, a method has also attracted attention in which a printing plate precursor is immersed in treating solution tanks filled with treating solutions and conveyed by means of in-liquid guide rolls. Such automatic processing can be performed while replenishers are being replenished into the respective treating solutions in accordance with the amounts to be treated, operating times, and other factors.

A so-called use-and-dispose processing manner can also be used, in which treatments are conducted with treating solutions which in practice have yet been used.

In cases where unnecessary image portions (for example, a film edge mark of an original picture film) are present on a planographic printing plate obtained by exposing imagewise to light a planographic printing plate precursor to which the invention is applied, developing the exposed precursor, and subjecting the developed precursor to water-washing and/or rinsing and/or desensitizing treatment(s), unnecessary image portions can be erased.

The erasing is preferably performed by applying an erasing solution to unnecessary image portions, leaving the printing plate as it is for a given time, and washing the plate with water, as described in, for example, JP-B No. 2-13293. This erasing may also be performed by a method of radiating active rays introduced through an optical fiber onto the unnecessary image portions, and then developing the plate, as described in JP-A No. 59-174842.

The planographic printing plate obtained as described above is, if desired, coated with a desensitizing gum, and subsequently the plate can be made available for a printing step. When it is desired to make a planographic printing plate have a higher degree of printing resistance, burning treatment is applied to the planographic printing plate.

In a case where the planographic printing plate is subjected to the burning treatment, it is preferable that before the burning treatment takes place the plate is treated with a surface-adjusting solution as described in JP-B No. 61-2518, or JP-A Nos. 55-28062, 62-31859 or 61-159655.

This method of treatment is, for example, a method of applying the surface-adjusting solution onto the planographic printing plate with a sponge or absorbent cotton infiltrated with the solution, a method of immersing the planographic printing plate in a vat filled with the surface-adjusting solution, or a method of applying the surface-adjusting solution to the planographic printing plate with an automatic coater. In a case where after application the amount of solution applied is made uniform with a squeegee or a squeegee roller, a better result can be obtained.

In general, the amount of surface-adjusting solution applied is suitably from 0.03 to 0.8 $g/m^2$ (dry mass). If necessary the planographic printing plate onto which the surface-adjusting solution is applied can be dried, and then the plate is heated to a high temperature by means of a burning processor (for example, a burning processor (BP-1300) sold by Fuji Photo Film Co., Ltd.) or the like. In this case the heating temperature and the heating time, which depend on the kind of components forming the image, are preferably from 180 to 300° C. and from 1 to 20 minutes, respectively. By means of this treatment, the recording layer related to the invention can manifest a superior burning printing resistance.

If necessary, a planographic printing plate subjected to burning treatment can be subjected to treatments which have been conventionally conducted, such as a water-washing treatment and gum coating. However, in a case where a surface-adjusting solution containing a water soluble polymer compound or the like is used, the so-called desensitizing treatment (for example, gum coating) can be omitted. The planographic printing plate obtained as a result of such treatments is applied to an offset printing machine or to some other printing machine, and is used for printing on a great number of sheets.

EXAMPLES

The present invention will be described in detail by way of the following examples. However, the invention is not limited to such examples. In the examples, planographic printing plate precursors wherein photosensitive compositions of the invention were used as recording layers, were evaluated, respectively, and the evaluation results were used to valuate the photosensitive compositions of the invention.

(Formation of Supports)

JIS-A-1050 aluminum plates having a thickness of 0.3 mm were used to conduct treatment wherein the following steps (a) to (j) were combined, whereby supports A, B, C and D were formed.

(a) Mechanical Surface-roughening Treatment

While a suspension of an abrasive agent (silica sand) having a specific gravity of 1.12 in water was supplied as an abrading slurry onto a surface of any one of the aluminum plates, the surface was mechanically roughened with rotating roller-shaped nylon brushes. The average grain size of the abrasive agent was 8 μm and the maximum grain size thereof was 50 μm. The material of the nylon brushes was 6,10-nylon, the length of bristles thereof was 50 mm, and the diameter of the bristles was 0.3 mm. The nylon brushes were each obtained by making holes in a stainless steel cylinder having a diameter of 300 mm and then planting bristles densely into the holes. The number of rotating brushes used was three. The distance between the two supporting rollers (diameter: 200 mm) under each of the brushes was 300 mm. Each of the brush rollers was pressed against the aluminum plate until the load of a driving motor for rotating the brush reached a level of 7 kW heavier than the load pertaining before the brush roller was pressed against the aluminum plate. The rotating direction of the brush was the same as the moving direction of the aluminum plate. The rotational speed of the brush was 200 rpm.

(b) Alkali Etching Treatment

A 70° C. aqueous solution of NaOH (NaOH concentration: 26% by mass, and aluminum ion concentration: 6.5% by mass) was sprayed onto the aluminum plate which had been produced as described above, the aluminum plate was etched and the aluminum plate was thereby dissolved by 6 g/m$^2$. Thereafter, the aluminum plate was washed with water.

(c) Desmut Treatment

The aluminum plate was subjected to desmut treatment by the spraying of a 30° C. aqueous solution having a nitric acid concentration of 1% by mass (and containing 0.5% by mass of aluminum ions), and the aluminum plate was then washed with sprayed water. The aqueous nitric acid solution used for the desmut treatment was waste liquid produced during the step of conducting an electrochemical surface-roughening treatment by using alternating current in an aqueous nitric acid solution.

(d) Electrochemical Surface-roughening Treatment

An alternating current of a frequency of 60 Hz was used to conduct an electrochemical surface-roughening treatment continuously. The electrolyte used for this process was a 10.5 g/L solution of nitric acid in water (containing 5 g/L of aluminum ions), and the temperature of the solution was 50° C. The wave of the alternating current was a trapezoidal wave wherein a time (TP), during which the current value was raised from zero to a peak, was 0.8 msec, and the Duty ratio of the current was 1:1. With the use of this trapezoidal wave alternating current, a carbon electrode was set as a counter electrode to conduct the electrochemical surface-roughening treatment. Ferrite was used as an auxiliary anode. The electrolyte bath used was of the radial cell type.

At its peak the density of the current was 30 A/dm$^2$ and the total quantity of electricity consumed while the aluminum plate functioned as an anode was 220 C/dm$^2$. Five percentage of the current emanating from the power source was diverted to the auxiliary anode.

Thereafter, the aluminum plate was washed with water.

(e) Alkali Etching Treatment

An aqueous solution having a caustic soda of 26% by mass and an aluminum ion concentration of 6.5% by mass was used to etch the aluminum plate at 32° C. so as to dissolve the aluminum plate by 0.20 g/m$^2$, thereby removing smut components formed mainly of aluminum hydroxide and generated during the previous step when the alternating current was used to conduct the electrochemical surface-roughening treatment. Moreover, edges of pits which has been formed were dissolved and made smooth. Thereafter, the aluminum plate was washed with sprayed well water.

(f) Desmut Treatment

The aluminum plate was subjected to a desmut treatment by means of spraying with a 30° C. aqueous solution having a nitric acid concentration of 15% by mass (and containing 4.5% by mass of aluminum ions), and the aluminum plate was then washed with water. The aqueous nitric acid solution used for the desmut treatment was waste liquid produced during the step of conducting the electrochemical surface-roughening treatment by using an alternating current in the aqueous nitric acid solution.

(g) Electrochemical Surface-roughening Treatment

An alternating current of a frequency of 60 Hz was used to conduct an electrochemical surface-roughening treatment continuously. The electrolyte used for this purpose was a 7.5 g/L solution of hydrochloric acid in water (containing 5 g/L of aluminum ions), and the temperature of the solution was 35° C. The wave of the alternating current was a rectangular wave. A carbon electrode was set as a counter electrode to conduct the electrochemical surface-roughening treatment. Ferrite was used as an auxiliary anode. The electrolyte bath used was of the radial cell type.

At its peak the density of the current was 25 A/dm$^2$ and the total quantity of electricity consumed while the aluminum plate functioned as an anode was 50 C/dm$^2$.

Thereafter, the aluminum plate was washed with water.

(h) Alkali Etching Treatment

An aqueous solution having a caustic soda of 26% by mass and an aluminum ion concentration of 6.5% by mass was sprayed onto the aluminum plate, the plate was etched at 32° C. and the plate was thereby dissolved by 0.10 g/m$^2$, thus removing smut components made mainly of aluminum hydroxide and generated during the previous step when the alternating current was used to conduct the electrochemical surface-roughening treatment. Moreover, edges of pits which had been formed were dissolved and made smooth. Thereafter, the aluminum plate was washed with water.

(i) Desmut Treatment

The aluminum plate was subjected to desmut treatment by the spraying of a 60° C. aqueous solution having a sulfuric acid concentration of 25% by mass (and containing 0.5% by mass of aluminum ions), and the aluminum plate was then washed with water.

(j) Anodizing Treatment

Sulfuric acid was used for the electrolytes. The electrolytes each had a sulfuric acid concentration of 170 g/L (and containing 0.5% by mass of aluminum ions), and the temperature of the electrolytes 43° C. Thereafter, the support was washed with water.

The densities of the currents were each about 30 A/dm$^2$, and the final amount of oxidation film was 2.7 g/m$^2$.

(k) Treatment with Alkali Metal Silicate

The aluminum support obtained as described above was immersed for ten seconds in a treatment tank containing a 30° C. aqueous solution of #3 sodium silicate (concentration of sodium silicate: 1% by mass) and the support was subjected to treatment with the alkali metal silicate (silicate treatment). Thereafter, the support was washed with water. The amount of silicate adhering at this stage was 3.5 mg/m$^2$.

<Support 1>

Steps (a) to (k) were successively performed and step (e) was conducted to set the etching amount at 3.5 g/m². A support 1 was thereby formed.

<Support 2>

Steps other than steps (g), (h) and (i) were successively performed, and a support 2 was thereby formed.

An intermediate layer coating solution with the following composition was applied onto each of the supports. Thereafter, the solution applied was dried at 80° C. for 15 seconds, so as to form an intermediate layer. The amount of the dried layer applied was 15 mg/m².

| <Undercoat solution composition> | |
|---|---|
| Intermediate layer polymer (compound described in Table 1) | 0.3 g |
| Methanol | 100 g |
| Water | 1 g |

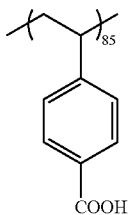
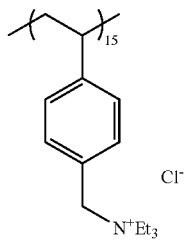

Intermediate layer polymer 1

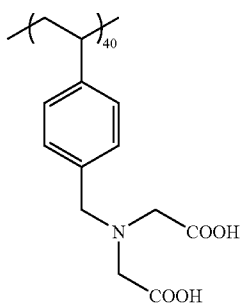

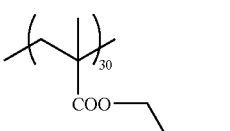

Intermediate layer polymer 2

Examples 1 to 8, and Comparative Example 1

A recording layer coating solution 1A described below was applied onto the resultant support 1 or 2 (i.e., the supports shown in Table 1 were used in each of the examples) in such a manner that the amount of the applied solution remaining after drying would be 0.85 g/m². Thereafter, a PERFECT OVENPH 200 dryer manufactured by TABAI Co., with its Wind Control of the solution being set to 7, was used so as to dry the support at 140° C. for 100 seconds, thereby forming a recording layer 1A. Thereafter, a recording layer coating solution 1B was applied onto the recording layer 1A in such a manner that the amount of the applied solution remaining after drying would be 0.30 g/m². Thereafter, the resultant coating was dried at 140° C. for 1 minute to form a recording layer 1B. This process was carried out multiple times to yield the planographic printing plate precursors of Examples 1 to 8 and Comparative Example 1.

| <Recording layer coating solution 1A> | |
|---|---|
| Novolak resin (phenol/m-cresol/p-cresol (= 20/50/30) containing 0.2% by weight of unreacted phenols, weight average molecular weight: 8,000) | amounts shown in Table 1 |
| Specific polymerizable polymer shown in Table 1 | 2.133 g |
| Infrared absorbent (cyanine dye A) having a structure illustrated below | 0.109 g |
| 4,4'-Bishydroxyphenylsulfone | 0.126 g |
| Tetrahydrophthalic anhydride | 0.190 g |
| p-Toluenesulfonic acid | 0.008 g |
| 3-Methoxy-4-diazophenylamine hexafluorophosphate | 0.030 g |
| Dye wherein the counter ion of Ethyl Violet was changed to 6-hydroxy-2-naphthalenesulfonic acid anion | 0.100 g |
| Coating-surface enhancing fluorine-containing surfactant (MEGAFAC F-780, manufactured by Dainippon Ink & Chemicals, Inc.) | 0.035 g |
| Methyl ethyl ketone | 25.38 g |
| 1-Methoxy-2-propanol | 13.0 g |
| γ-Butyrolactone | 13.2 g |

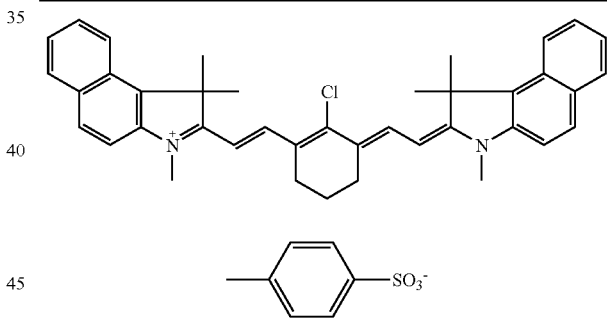

Cyanine dye A

| <Recording layer coating solution 1B> | |
|---|---|
| m/p-Cresol Novolak resin (containing 0.8% by mass of unreacted cresol, the ratio of m/p = 6/4, weight average molecular weight: 4500) | 0.3478 g |
| Infrared absorbent (cyanine dye A) having the structure illustrated above | 0.0192 g |
| Onium salt B having a structure illustrated below | 0.0115 g |
| Coating-surface property improving fluorine-containing surfactant (MEGAFAC F-780, manufactured by Dainippon Ink & Chemicals, Inc.) | 0.022 g |
| Methyl ethyl ketone | 13.07 g |
| 1-Methoxy-2-propanol | 6.79 g |

-continued

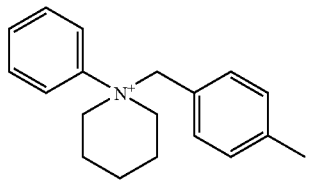

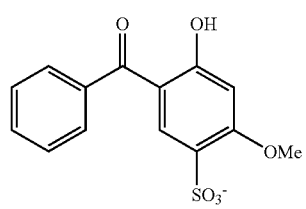

Onium salt B

Examples 9 to 13, and Comparative Example 2

A recording layer coating solution 2 described below was applied onto the resultant support 1 or 2 (i.e., the supports shown in Table 1 were used in each of the examples) in such a manner that the amount of applied solution remaining after drying would be 1.0 g/m². Thereafter, a PERFECT OVENPH 200 dryer manufactured by TABAI Co., with its Wind Control of the solution being set to 7, was used so as to dry the support at 140° C. for 60 seconds, thereby forming a recording layer 2. This process was carried out multiple times to yield planographic printing plate precursors of Examples 9 to 13 and Comparative Example 2.

| <Recording layer coating solution 2> | |
|---|---|
| m/p-Cresol Novolak resin (containing 0.8% by mass of unreacted cresol, the ratio of m/p = 6/4, weight average molecular weight: 4500) | 0.474 g |
| Specific polymerizable polymer shown in Table 1 | 2.37 g |
| Infrared absorbent (cyanine dye A) having the structure illustrated above | 0.155 g |
| 2-Methoxy-4-(N-phenylamino) benzodiazonium hexafluorophosphate | 0.03 g |
| Tetrahydrophthalic anhydride | 0.19 g |
| Dye wherein the counter ion of Ethyl Violet was changed to 6-hydroxy-β-naphthalenesulfonate | 0.11 g |
| Coating-surface property improving fluorine-containing surfactant (MEGAFAC F-780, manufactured by Dainippon Ink & Chemicals, Inc.) | 0.02 g |
| Coating-surface property improving fluorine-containing surfactant (MEGAFAC F-781, manufactured by Dainippon Ink & Chemicals, Inc.) | 0.02 g |
| p-Toluenesulfonic acid | 0.008 g |
| Bis-p-hydroxyphenylsulfone | 0.13 g |
| Dimyristyl 3,3'-thiodipropionate | 0.04 g |
| Lauryl stearate | 0.02 g |
| γ-Butyrolactone | 13 g |
| Methyl ethyl ketone | 24 g |
| 1-Methoxy-2-propanol | 11 g |

In both of Comparative Examples 1 and 2, instead of the specific polymerizable polymer, the following was added to the recording layer coating solution: a copolymer Q-1 (an alkali-soluble resin outside the scope of the definition of the invention), which has a weight average molecular weight Mw described below and which is made from monomers having structures and polymerization mole percentages described below and having neither a polymerizable group nor a cross-linkable group:

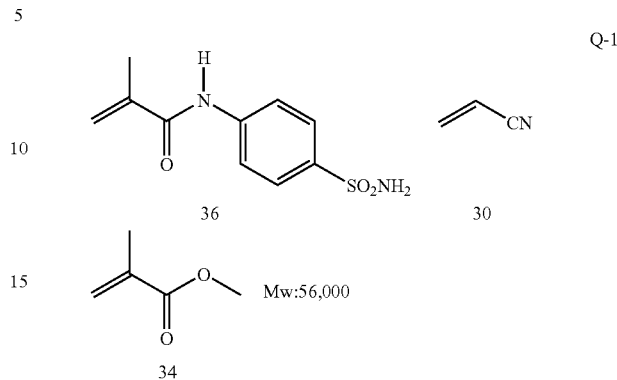

[Evaluation of the Planographic Printing Plate Precursors]

[Development Latitude Evaluation]

A Trend Setter 800 Quantum manufactured by CREO Co. was used to expose imagewise to light at 10 W/250 rpm the planographic printing plate precursors of Examples 1 to 13, and of Comparative Examples 1 and 2. Then, the precursors were developed with an automatic developing machine LP-940H, wherein a developer "DT-2" for photosensitive plates, manufactured by Fuji Photo Film Co., Ltd., was placed into a developing bath under standard use conditions of use (1:8) and a solution "FS-2W" (1:1) was placed into 3 baths.

[Printing Resistance Evaluation]

Each of the resultant planographic printing plates and a "DIC-GEOS(N) Black" ink manufactured by Dainippon Ink & Chemicals, Inc. were used to print solid images on sheets on a Lithron printer, manufactured by Komori Corp. The printing resistance of the plate was evaluated on the basis of the number of printed sheets obtained up to a moment when it was discernible with the naked eye that the density of solid images had started to diminish.

[Evaluation of Printing Resistance After Burning Treatment]

The surface of each of the planographic printing plates obtained through the same process as that described in the printing resistance evaluation described above was washed with water, and wiped with a burning surface-adjusting solution "BC-7" manufactured by Fuji Photo Film Co., Ltd. Thereafter, the plate was subjected to burning treatment at about 270° C. for 2 minutes. Thereafter, the plate was washed with water and then the plate surface was treated with a solution obtained by diluting with an equal volume of water "FP-2W" manufactured by Fuji Photo Film Co., Ltd.

Thereafter, in the same manner as in the printing resistance evaluation, the resultant planographic printing plate and the "DIC-GEOS (N) Black" ink manufactured by Dainippon Ink & Chemicals, Inc. were used to print solid images on sheets, on a Lithron printer, manufactured by Komori Corp. Printing resistance after burning treatment (which will be referred to as "Burning printing resistance" hereinafter) of the plate was evaluated on the basis of the number of printed sheets obtained up to a moment when it was discernible with the naked eye that the density of the solid images had started to diminish. The results are shown in Table 1.

TABLE 1

| | Support | Intermediate layer | Photosensitive layer coating solution | Polymerizable polymer | Printing resistance (x 10000 = the number of sheets) Not burned | Burned |
|---|---|---|---|---|---|---|
| Example 1 | 1 | Intermediate layer polymer 1 | 1A/1B | P-1 | 5.0 | 15 |
| Example 2 | 1 | Intermediate layer polymer 1 | 1A/1B | P-2 | 4.8 | 16 |
| Example 3 | 1 | Intermediate layer polymer 1 | 1A/1B | P-3 | 5.3 | 15 |
| Example 4 | 1 | Intermediate layer polymer 1 | 1A/1B | P-4 | 5.0 | 15 |
| Example 5 | 1 | Intermediate layer polymer 1 | 1A/1B | P-5 | 5.0 | 14 |
| Example 6 | 1 | Intermediate layer polymer 2 | 1A/1B | P-1 | 5.0 | 15 |
| Example 7 | 2 | Intermediate layer polymer 1 | 1A/1B | P-2 | 5.3 | 15 |
| Example 8 | 2 | Intermediate layer polymer 2 | 1A/1B | P-4 | 5.0 | 15 |
| Comparative Example 1 | 1 | Intermediate layer polymer 1 | 1A/1B | Q-1 | 4.8 | 5.0 |
| Example 9 | 1 | Intermediate layer polymer 1 | 2 | P-1 | 5.0 | 15 |
| Example 10 | 1 | Intermediate layer polymer 1 | 2 | P-2 | 5.0 | 15 |
| Example 11 | 1 | Intermediate layer polymer 1 | 2 | P-3 | 5.0 | 15 |
| Example 12 | 1 | Intermediate layer polymer 1 | 2 | P-4 | 5.0 | 15 |
| Example 13 | 1 | Intermediate layer polymer 1 | 2 | P-5 | 5.0 | 15 |
| Comparative Example 2 | 1 | Intermediate layer polymer 1 | 2 | Q-1 | 4.8 | 4.8 |

The results in Table 1 demonstrate the superior printing resistance of the planographic printing plate precursors of Examples 1 to 8, wherein the photosensitive compositions of the invention that each contained the specific polymerizable polymer were used in multilayered recording layers. This superior printing resistance was conspicuously enhanced by the burning treatment. The results also demonstrate that in the planographic printing plate precursor of Comparative Example 1, in which a polymer compound having neither a polymerizable group nor a cross-linkable group was used, no improvement in printing resistance by burning was observed.

From the results of Examples 9 to 13, it can be verified that even when a planographic printing plate precursor using the photosensitive composition of the invention has a mono-layered recording layer, the precursor still has superior printing resistance, a superiority which is also conspicuously enhanced by burning treatment. From the result of Comparative Example 2, it has also become evident that a planographic printing plate precursor, in which a polymer compound having neither a polymerizable group nor a cross-linkable group is used has somewhat poor printing resistance and that there are no grounds for concluding that printing resistance is enhanced by burning treatment.

What is claimed is:

1. A positive type photosensitive composition comprising:
   a polymer compound (A) having, in a side chain thereof, a polymerizable group, and
   an infrared absorbent (B),
   wherein the polymer compound (A) interacts with the infrared absorbent (B), thereby exhibiting good resistance against an alkaline developer,
   wherein polymer compound (A) comprises, in molecules thereof, a structural unit having a polymerizable group in a side chain thereof,
   wherein the structural unit having a polymerizable group has a structure represented by one of the following general formulae (1) and (2):

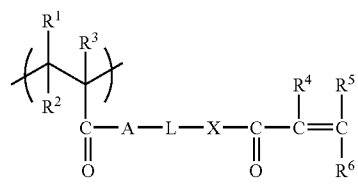

(1)

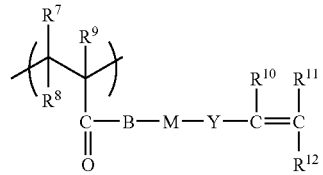

(2)

wherein A, B and X each independently represents a single bond, an oxygen atom, a sulfur atom, or $-N(R^{01})-$, wherein $R^{01}$ represents a hydrogen atom or a monovalent organic group; L and M each independently represents a bivalent organic group; $R^1$ to $R^{12}$ each independently represents a hydrogen atom or a monovalent organic group; and Y represents an oxygen atom, a sulfur atom $-N(R^{02})-$, wherein $R^{02}$ represents a hydrogen atom or a monovalent organic group, or a phenylene group which may have a substituent.

2. The positive type photosensitive composition according to claim 1, wherein, relative to a total of copolymerization components which constitute polymer compound (A), a copolymerization ratio of the structural unit having a polymerizable group in a side chain therof, is 10% by mole or more.

3. The positive type photosensitive composition according to claim 1, wherein the polymer compound (A) having a polymerizable group in a side chain thereof comprises a structural unit having an alkali-soluble group.

4. The positive type photosensitive composition according to claim 3, wherein the alkali-soluble group is an acidic group.

5. The positive type photosensitive composition according to claim 3, wherein, relative to a total of copolymerization components which constitute polymer compound (A), a copolymerization ratio of the structural unit having an alkali-soluble group, is 10% by mole or more.

6. The positive type photosensitive composition according to claim 1, wherein polymer compound (A) comprises as a copolymerization component an alkyl acrylate or an alkyl methacrylate.

7. The positive type photosensitive composition according to claim 6, wherein the alkyl acrylate or the alkyl methacrylate is an alkyl group having 2 to 10 carbon atoms.

8. The positive type photosensitive composition according to claim 1, wherein a weight average molecular weight of polymer compound (A) is from 10,000 to 300,000.

9. The positive type photosensitive composition according to claim 1, relative to a total of solid contents in the photosensitive composition, a content of polymer compound (A) is 10% or more by mass.

10. The positive type photosensitive composition according to claim 1, which is capable of being used as a material for a recording layer made of an upper layer which forms a surface of the recording layer and a lower layer positioned beneath the upper layer, the lower layer comprising the polymer compound (A), and the upper layer comprising the infrared absorbent (B).

11. The positive type photosensitive composition according to claim 10, wherein polymer compound (A) comprises a structural unit having an alkali-soluble group.

12. A positive type photosensitive composition comprising:
a polymer compound (A) having, in a side chain thereof, a cross-linkable group, and
an infrared absorbent (B),
wherein the polymer compound (A) interacts with the infrared absorbent (B), thereby exhibiting good resistance against an alkaline developer,
wherein polymer compound (A) comprises, in molecules thereof, a structural unit having a cross-linkable group in a side chain thereof,
wherein the structural unit having a cross-linkable group has a structure represented by one of the following general formulae (3) and (4):

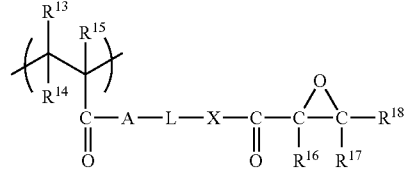

(3)

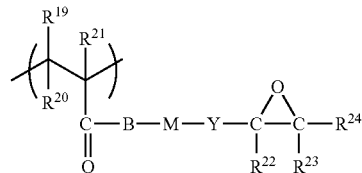

(4)

wherein A, B and X each independently represents a single bond, an oxygen atom, a sulfur atom, or $-N(R^{03})-$, wherein $R^{03}$ represents a hydrogen atom or a monovalent organic group; L and M each independently represents a bivalent organic group; $R^{13}$ to $R^{24}$ each independently represents a monovalent organic group; and Y represents an oxygen atom, a sulfur atom, $-N(R^{04})-$, wherein $R^{04}$ represents a hydrogen atom or a monovalent organic group, or a phenylene group which may have a substituent.

13. The positive type photosensitive composition according to claim 12, wherein, relative to a total of copolymerization components which constitute polymer compound (A), a copolymerization ratio of the structural unit having a cross-linkable group in a side chain thereof, is 10% by mole or more.

14. The positive type photosensitive composition according to claim 12, wherein the polymer compound (A) having a cross-linkable group in a side chain thereof comprises a structural unit having an alkali-soluble group.

15. The positive type photosensitive composition according to claim 14, wherein the alkali-soluble group is an acidic group.

16. The positive type photosensitive composition according to claim 14, wherein, relative to a total of copolymerization components which constitute polymer compound (A), a copolymerization ratio of the structural unit having an alkali-soluble group, is 10% by mole or more.

17. The positive type photosensitive composition according to claim 12, wherein polymer compound (A) comprises as a copolymerization component an alkyl acrylate or an alkyl methacrylate.

18. The positive type photosensitive composition according to claim 17, wherein the alkyl acrylate or the alkyl methacrylate is an alkyl group having 2 to 10 carbon atoms.

19. The positive type photosensitive composition according to claim 12, wherein a weight average molecular weight of polymer compound (A) is from 10,000 to 300,000.

20. The positive type photosensitive composition according to claim 12, relative to a total of solid contents in the photosensitive composition, a content of polymer compound (A) is 10% or more by mass.

21. The positive type photosensitive composition according to claim 12, which is capable of being used as a material for a recording layer made of an upper layer which forms a surface of the recording layer and a lower layer positioned beneath the upper layer, the lower layer comprising the polymer compound (A), and the upper layer comprising the infrared absorbent (B).

22. The positive type photosensitive composition according to claim 21, wherein polymer compound (A) comprises a structural unit having an alkali-soluble group.

23. A positive type photosensitive composition comprising:
a polymer compound (A) having, in a side chain thereof, a polymerizable group,
an infrared absorbent (B), and
an alkali-soluble resin (C),
wherein polymer compound (A) comprises, in molecule thereof, a structural unit having in a side chain thereof a polymerizable group, and the polymer compound (A) interacts with the infrared absorbent (B), thereby exhibiting good resistance against an alkaline developer,
wherein the structural unit having a polymerizable group has a structure represented by one of the following general formulae (1) and (2):

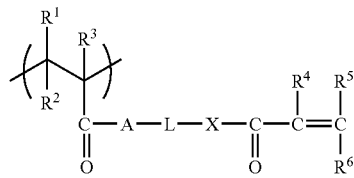

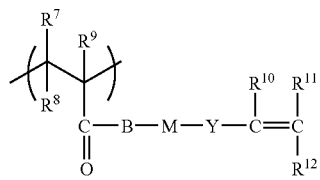

wherein A, B and X each independently represents a single bond, an oxygen atom, a sulfur atom, or —N(R$^{O1}$)—, wherein R$^{O1}$ represents a hydrogen atom or a monovalent organic group; L and M each independently represents a bivalent organic group; R$^1$ to R$^{12}$ each independently represents a hydrogen atom or a monovalent organic group; and Y represents an oxygen atom, a sulfur atom, —N(R$^{O2}$)—, wherein R$^{O2}$ represents a hydrogen atom or a monovalent organic group, or a phenylene group which may have a substituent.

24. The positive type photosensitive composition according to claim 23, wherein, in a unexposed portion, an interaction between infrared absorbent (B) and the alkali-soluble resin (C) restricts solubility of alkali-soluble resin (C), and in an exposed-portion the interaction is neutralized and solubility of alkali-soluble resin (C) is restored, and when subjected to burning treatment, a polymerizable group of molecules in polymer compound (A) effects a polymerizing reaction with each other.

25. The positive type photosensitive composition according to claim 23, wherein the polymerizable group, of molecules of polymer compound (A), when subjected to burning treatment, effects a polymerizing reaction with alkali-soluble resin (C).

26. The positive type photosensitive composition according to claim 23, which is capable of being used as a material for a recording layer made of an upper layer which forms a surface of the recording layer and a lower layer positioned beneath the upper layer, the lower layer comprising the polymer compound (A) and alkali-soluble resin (C), and the upper layer comprising infrared absorbent (B) and alkali-soluble resin (C).

27. The positive type photosensitive composition according to claim 26, wherein polymer compound (A) comprises a structural unit having an alkali-soluble group.

28. A positive type photosensitive composition comprising:
a polymer compound (A) having, in a side chain thereof, a cross-linkable group,
an infrared absorbent (B), and
an alkali-soluble resin (C),
wherein polymer compound (A) comprises, in molecule thereof, a structural unit having in a side chain thereof a cross-linkable group, and the polymer compound (A) interacts with the infrared absorbent (B), thereby exhibiting good resistance against an alkaline developer,
wherein the structural unit having cross-linkable group has a structure represented by one of the following general formulae (3) and (4):

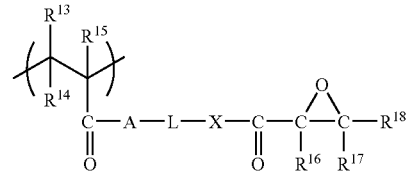

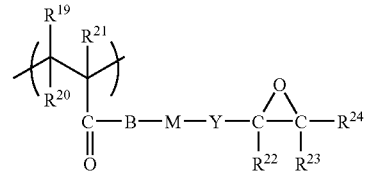

wherein A, B and X each independently represents a single bond, an oxygen atom, a sulfur atom, or —N(R$^{O3}$)—, wherein R$^{O3}$ represents a hydrogen atom or a monovalent organic group; L and M each independently represents a bivalent organic group; R$^{13}$ to R$^{24}$ each independently represents a monovalent organic group; and Y represents an oxygen atom, a sulfur atom, —N(R$^{O4}$)—, wherein R$^{O4}$ represents a hydrogen atom or a monovalent organic group, or a phenylene group which may have a substituent.

29. The positive type photosensitive composition according to claim 28, wherein, in a unexposed portion, an interaction between infrared absorbent (B) and the alkali-soluble resin (C) restricts solubility of alkali-soluble resin (C), and in an exposed-portion the interaction is neutralized and solubility of alkali-soluble resin (C) is restored, and when subjected to burning treatment, a cross-linkable group of molecules in polymer compound (A) effects a cross-linking reaction with each other.

30. The positive type photosensitive composition according to claim 28, wherein the cross-linkable group of molecules of polymer compound (A), when subjected to burning treatment, effects a cross-linking reaction with alkali-soluble resin (C).

31. The positive type photosensitive composition according to claim 28, which is capable of being used as a material for a recording layer made of an upper layer which forms a surface of the recording layer and a lower layer positioned beneath the upper layer, the lower layer comprising the polymer compound (A) and alkali-soluble resin (C), and the upper layer comprising infrared absorbent (B) and alkali-soluble resin (C).

32. The positive type photosensitive composition according to claim 31, wherein polymer compound (A) comprises a structural unit having an alkali-soluble group.

* * * * *